United States Patent [19]
Kolenkow

[11] Patent Number: 5,830,327
[45] Date of Patent: Nov. 3, 1998

[54] METHODS AND APPARATUS FOR SPUTTERING WITH ROTATING MAGNET SPUTTER SOURCES

[75] Inventor: Robert J. Kolenkow, Berkeley, Calif.

[73] Assignee: Intevac, Inc., Santa Clara, Calif.

[21] Appl. No.: 724,792

[22] Filed: Oct. 2, 1996

[51] Int. Cl.$^6$ .................................................. C23C 14/34
[52] U.S. Cl. ............................ 204/192.12; 204/298.19; 204/298.2; 204/298.26
[58] Field of Search .................... 204/192.12, 298.19, 204/298.2, 298.26, 192.2, 298.25

[56] References Cited

U.S. PATENT DOCUMENTS

| | | | |
|---|---|---|---|
| 4,558,388 | 12/1985 | Graves, Jr. ................. | 204/298.25 X |
| 4,894,133 | 1/1990 | Hedgcoth .................. | 204/398.26 X |
| 4,995,958 | 2/1991 | Anderson et al. ........... | 024/298.2 |
| 5,047,130 | 9/1991 | Akao et al. ................ | 204/192 |
| 5,188,717 | 2/1993 | Broadbent et al. .......... | 204/298.2 X |
| 5,248,402 | 9/1993 | Ballentine et al. .......... | 204/298.2 |
| 5,252,194 | 10/1993 | Demaray et al. ............ | 204/298.2 |
| 5,314,597 | 5/1994 | Harra ....................... | 204/298.2 X |
| 5,320,728 | 6/1994 | Tepman ..................... | 204/298.12 |

Primary Examiner—Nam Nguyen
Attorney, Agent, or Firm—Stanley Z. Cole; William R. McClellan

[57] ABSTRACT

A magnetron sputtering source for forming a sputtered film on a substrate in a magnetron sputtering apparatus includes a target having a surface from which material is sputtered and a magnet assembly that is rotatable about an axis of rotation with respect to the target. The magnet assembly produces on the target an erosion profile that is calculated to yield a desired depositional thickness distribution and inventory. A method for configuring the rotatable magnet assembly includes the steps of determining an optimal erosion profile that yields the desired depositional thickness distribution and inventory, determining a plasma track on the surface of the target that produces an acceptable approximation to the optimal erosion profile, and determining a magnet structure that produces the plasma track.

17 Claims, 15 Drawing Sheets

METHODS AND APPARATUS FOR SPUTTERING WITH ROTATING MAGNET SPUTTER SOURCES

FIELD OF THE INVENTION

This invention relates to deposition of sputtered films on substrates and, more particularly, to rotating magnet sputtering methods and apparatus which provide long target life, broad erosion patterns and depositional thickness uniformity.

BACKGROUND OF THE INVENTION

Sputter deposition, also known as sputter coating, is a technique for depositing thin films of desired materials on a substrate such as, for example, a magnetic disk for a hard disk drive or a semiconductor wafer. In general, inert gas ions from a gas plasma are accelerated toward a target of the material to be deposited. Free atoms of the target material are expelled when the ions collide with the target. A portion of the free atoms form a thin film on the surface of the substrate.

One well known sputtering technique is magnetron sputtering. Magnetron sputtering uses a magnetic field to concentrate the sputtering action. Magnets are positioned behind the target, and magnetic field lines penetrate the target and form arcs over its surface. The magnetic field helps to confine free electrons in an area near the surface of the target. The resulting increased concentration of free electrons produces a high density of inert gas ions and enhances the efficiency of the sputtering process.

Both fixed and movable magnet structures have been utilized in magnetron sputtering. In a typical structure utilizing a moving magnet, the target is circular and the magnet structure rotates with respect to the center of the target. In either configuration, the sputtering process produces an erosion pattern on the target that is nonuniform. To avoid contaminating the substrate, sputtering must be stopped before the erosion pattern has consumed the full thickness of the target material at any point. The target must be replaced when the erosion at any point approaches a substantial fraction of the target's initial thickness. Thus in a given production process, only a certain number of substrates can be coated from one target. The sputtering apparatus must be shut down during a target change and is nonproductive during this period, with a consequent undesirable and costly decrease in average throughput.

Three basic approaches may be used to increase the number of substrates a target can coat before the target must be replaced. The thickness of the target can be increased to increase the volume of material to be removed from the target before it is spent. Second, the shape of the erosion profile can be altered by design to make greater use of the target volume. Finally, the target-to-substrate distance can be decreased so as to capture a larger percentage of the material sputtered from the target. However, performance may be degraded as the thickness of the target is increased. In particular, the field strength at the target surface may be decreased, decreasing the efficiency of sputtering. Also, deposition uniformity may show greater variation over the target life because of the variation in target-to-substrate distance.

The design and physical realization of a suitable erosion profile has remained a problem in magnetron source design. Sources have been designed having uniform erosion over much of the target, which maximizes use of the target volume, but the corresponding deposition uniformity under typical process conditions has not been acceptable. Decreasing the target-to-substrate distance can degrade deposition uniformity, unless the erosion profile is redesigned to compensate.

Another problem in current sputter coating systems is that certain areas of the target, especially the center region, experience no sputtering. Redeposition from sputtered atoms turned back to the target by gas scattering can accumulate in the nonsputtered regions. The accumulated redeposition may be a poor conductor and may promote a low voltage arc breakdown, with consequent undesirable generation of particles that can contaminate the substrate being coated. In the prior art, sputtering of the center region has been achieved by complex mechanical motion of the magnet structure relative to the target.

An apparently related phenomenon is the growth of poorly conducting nodules on the target surface when sputtering from a carbon target, as is used in magnetic disk coating. In production runs, it may be necessary to halt the machine from time to time to clean the carbon targets.

U.S. Pat. No. 4,995,958 issued Feb. 26, 1991 to Anderson et al. discloses a sputtering apparatus with a rotating magnet array having a geometry which produces a selected erosion profile on the target. The selected erosion profile is typically nearly constant with radius over a selected region. The centerline of the magnet structure is described by an equation. The disclosed track equation is not fully general and does not describe all possible plasma tracks. In particular, the track equation cannot be used to describe an erosion profile that extends to the center of the target.

U.S. Pat. No. 5,252,194 issued Oct. 12, 1993 to Demaray et al. discloses a magnetron sputter source which includes a rotating magnet assembly that is stated to produce uniform target erosion across the full target surface, including the center. The target surface may be planar or dished.

U.S. Pat. No. 5,314,597 issued May 24, 1994 to Harra discloses a sputtering apparatus including a rotatable magnet configuration for obtaining a desired sputter target erosion profile and a desired film characteristic. In developing the magnet configuration, a heart-shaped plasma track having an erosion profile near the desired profile is utilized. A static erosion test, with the magnet structure not rotating, is run to develop a measurable static erosion groove in the target. The depth of erosion is measured at various points on the target in such a way as to quantify the erosion along radial spokes at fixed values of polar angle. The magnet configuration is then adjusted to provide an erosion profile that is closer to the desired profile. The process is repeated until the desired profile is achieved. The '597 patent discloses a relationship for finding thickness uniformity given an erosion profile, but does not disclose how to find an erosion profile given a desired thickness variation.

U.S. Pat. No. 5,120,417 issued Jun. 9, 1992 to Takahashi et al. discloses a magnetron sputtering apparatus including a rotating magnet structure which is stated to erode the central region of the target and thereby reduce the number of particulates deposited on the substrate.

U.S. Pat. No. 5,130,005 issued Jul. 14, 1992 to Hurwitt et al. discloses a magnetron sputter coating apparatus including a rotating magnet structure comprising a stack of flexible plasticized ferrite and several auxiliary magnets which provide a desired plasma track. The magnet structure is rotated in a cavity filled with water. The surface of the target is machined to a cylindrically symmetric shape which is thicker near the outer rim.

U.S. Pat. No. 5,188,717 issued Feb. 23, 1993 to Broadbent et al. discloses a magnetron sputtering apparatus including a rotating magnet assembly which produces a plasma track comprising a closed curve that is stated to have the shape of a kidney bean. The closed curve is generated in part by a spiral curve generated by the same equation disclosed by Anderson et al. in U.S. Pat. No. 4,995,958. The magnet assembly is simultaneously rotated about a center of rotation and is caused to oscillate radially with respect to the center of rotation so as to produce erosion over the entire target surface.

U.S. Pat. No. 5,248,402 issued Sep. 28, 1993 to Ballentine et al. discloses a magnetron sputtering system including a rotating magnet assembly that is characterized as apple shaped. The disclosed magnet assembly is stated to produce uniform coatings and erosion over the entire surface of the target.

U.S. Pat. No. 5,417,833 issued May 23, 1995 to Harra et al. discloses a magnetron sputtering apparatus including a rotating magnet assembly and a pair of separately driven stationary electromagnets. The electromagnets are used to increase target utilization at its center and to compensate for the change in shape of the target and distance from the target to the substrate with depletion.

Magnetron sputtering systems which utilize a rotating magnet assembly are also disclosed in U.S. Pat. No. 4,444,643 issued Apr. 24, 1984 to Garrett; U.S. Pat. No. 4,714,536 issued Dec. 22, 1987 to Freeman et al.; U.S. Pat. No. 4,746,417 issued May 24, 1988 to Ferenbach et al.; U.S. Pat. No. 5,047,130 issued Sep. 10, 1991 to Akao et al.; U.S. Pat. No. 5,194,131 issued Mar. 16, 1993 to Anderson; and U.S. Pat. No. 5,320,728 issued Jun. 14, 1994 to Tepman.

All of the known prior art magnetron sputtering systems utilizing rotating magnet assemblies have had one or more disadvantages, including but not limited to short target life, nonuniform depositional thickness, variations in performance over the life of the target, contamination of the substrate, complex mechanical drive structures and a requirement for nonplanar target surfaces.

SUMMARY OF THE INVENTION

According to the present invention, a magnetron sputtering source is provided for forming a sputtered film on a substrate in a magnetron sputtering apparatus. The magnetron sputtering source comprises a target having a surface from which material is sputtered and a magnet assembly that is rotatable about an axis of rotation with respect to the target. The magnet assembly produces on the target an erosion profile that approximates a solution to an equation of the form $$\int_a^b K(r,r')e(r')r'dr' = t(r)$$

where e(r') is the erosion profile, t(r) is a desired radial thickness distribution of the sputtered film, K(r,r') is a function depending on the sputter geometry and process conditions, r is the radial position on the substrate, r' is the radial position on the target, and a and b are the radial limits of erosion on the target. Although for many applications it may be desirable to choose t(r)=constant to specify uniform thickness, the invention also includes cases where t(r) varies in a specified non-uniform fashion across the substrate.

According to another aspect of the invention, a method is provided for configuring a rotatable magnet assembly for use in the magnetron sputtering apparatus. The magnetron sputtering apparatus includes a target having a surface from which material is sputtered to form a sputtered film on a substrate. The method comprises the steps of determining an erosion profile on the target that approximates a solution to an equation of the form $$\int_a^b K(r,r')e(r')r'dr' = t(r)$$

where e(r') is the erosion profile, t(r) is a desired radial thickness distribution of the sputtered film, K(r,r') is a function depending on the sputter geometry and process conditions, r is the radial position on the substrate, r' is the radial position on the target, and a and b are the radial limits of erosion on the target, and determining a magnet structure for the rotatable magnet assembly that produces an acceptable approximation to the erosion profile e(r'). Although for many applications it may be desirable to choose t(r)=constant to specify uniform thickness, the invention also includes cases where t(r) varies in a specified non-uniform fashion across the substrate.

According to another aspect of the invention, a magnetron sputtering source is provided for forming a sputtered film on a substrate in a magnetron sputtering apparatus. The magnetron sputtering source comprises a target having a surface from which material is sputtered and a magnet assembly that is rotatable about an axis of rotation with respect to the target. The magnet assembly produces on the surface of the target a plasma track having a shape characterized by a pair of symmetrical lobes, a deeply indented first inward cusp located near the axis of rotation and a moderately indented second inward cusp. The first and second cusps are located on opposite sides of the plasma track. Each of the lobes has a relatively long section of substantially constant radius with respect to the axis of rotation.

According to another aspect of the invention, a magnetron sputtering source is provided for forming a sputtered film on a substrate in a magnetron sputtering apparatus. The magnetron sputtering source comprises a target having a surface from which material is sputtered and a magnet assembly that is rotatable about an axis of rotation with respect to the target. The magnet assembly produces on the target an erosion profile characterized by a relatively deep first circular groove near an outer periphery of the target, a relatively shallow second circular groove near the center of the target and an intermediate region between the first and second grooves. The intermediate region has a shallower erosion depth than the first and second grooves.

According to another aspect of the invention, a magnetron sputtering source is provided for forming a sputtered film on a substrate in a magnetron sputtering apparatus. The magnetron sputtering source comprises a target having a surface from which material is sputtered and a magnet assembly that is rotatable about an axis of rotation with respect to the target. The magnet assembly and the target produce a radial thickness distribution of the sputtered film on the substrate that is uniform to better than about ±5% for a source-to-substrate distance of less than about 35 millimeters.

According to another aspect of the invention, a method is provided for configuring a rotatable magnet assembly for use in a magnetron sputtering apparatus including a target having a surface from which material is sputtered to form a sputtered film on a substrate. The method comprises the steps of determining an erosion profile on the target that produces a desired radial thickness distribution of the sputtered film on the substrate and a desired inventory of the sputtered material on one or more substrates, determining a plasma track on the surface of the target that produces an acceptable approximation to the erosion profile and determining a magnet structure for the rotatable magnet assembly that produces an acceptable approximation to the plasma track.

According to another aspect of the invention, a magnetron sputtering apparatus is provided. The magnetron sputtering apparatus comprises a first magnetron sputtering source for forming a sputtered film on a first surface of a substrate and a second magnetron sputtering source for forming a sputtered film on a second surface of the substrate. The first magnetron sputtering source includes a first target having a surface from which material is sputtered and a first magnet assembly that is rotatable about an axis of rotation with respect to the first target. The second magnetron sputtering source includes a second target having a surface from which material is sputtered and a second magnet assembly that is rotatable about an axis of rotation with respect to the second target. The first and second magnet assemblies produce on the surfaces of the first and second targets plasma tracks, each having a shape characterized by a pair of symmetrical lobes, a deeply indented first inward cusp located near the axis of rotation and a moderately indented second inward cusp. The first and second cusps are located on opposite sides of the plasma track. Each of the lobes has a relatively long section of substantially constant radius with respect to the axis of rotation. The magnetron sputtering apparatus further includes a vacuum system for producing a vacuum in regions between each target surface and the substrate.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
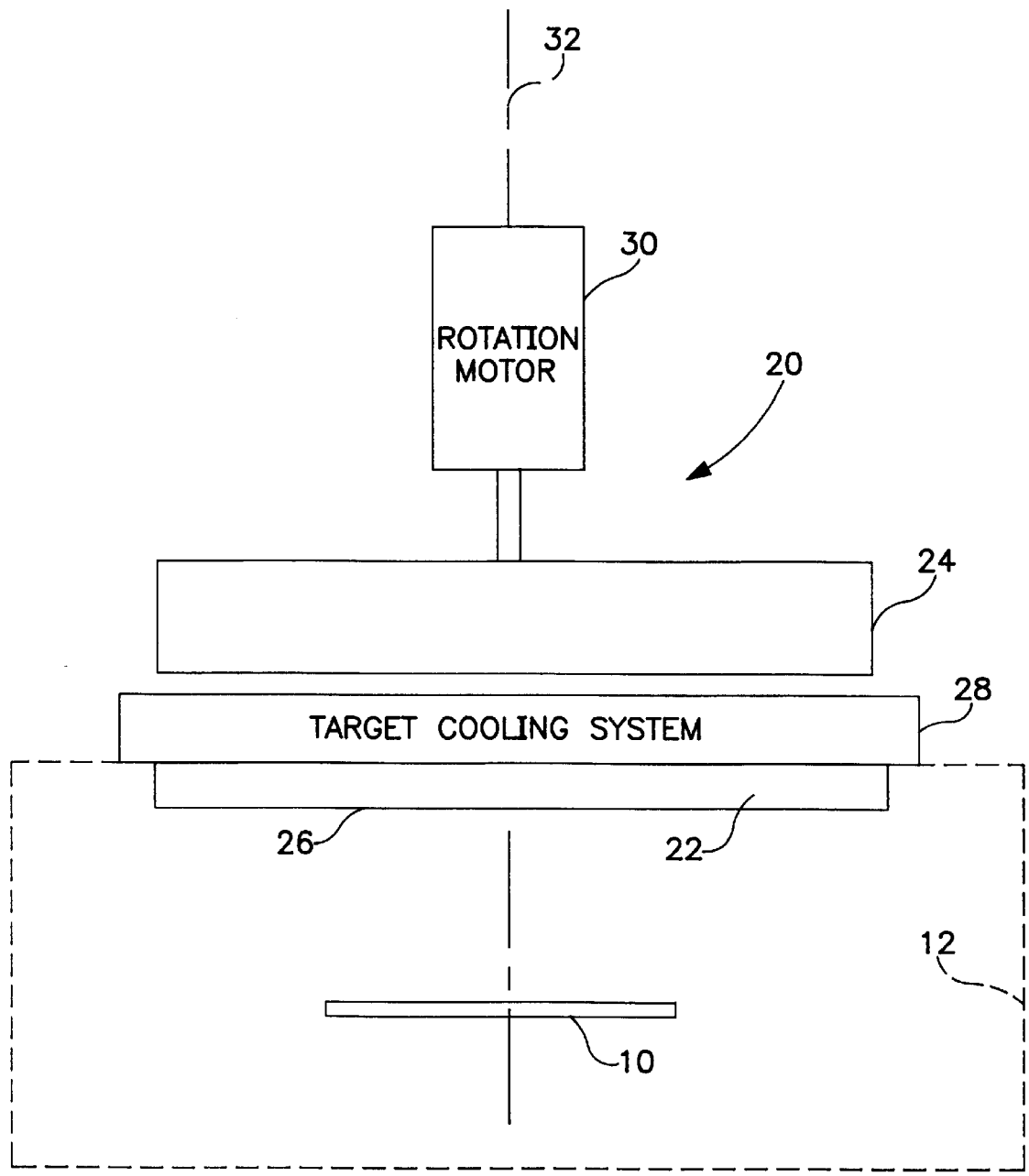
FIG. 1 is a simplified schematic diagram of a rotating magnet sputtering system.

A simplified schematic diagram of a rotating magnet sputter coating system is shown in FIG. 1. A substrate 10, such as for example a magnetic disk, is positioned in a vacuum chamber 12. A rotating magnet sputter source 20 includes a sputtering target 22 of a material to be deposited on substrate 10, a rotating magnet assembly 24, and a rotation motor 30 which causes the rotating magnet assembly 24 to rotate about an axis of rotation 32 with respect to target 22. A magnet array in rotating magnet assembly 24 produces magnetic fields which penetrate target 22 and form arcs over a surface 26 of target 22 facing substrate 10. The target 22 is cooled by a target cooling system 28.

The magnetic field helps to confine free electrons in an area near the surface 26 of the target. The increased concentration of free electrons produces high densities of inert gas ions, typically argon, and enhances the efficiency of the sputtering process. In particular, the region of most intense ionization forms a closed loop plasma track on the surface 26 of target 22. The configuration of the plasma track is discussed in detail below. As the rotating magnet assembly 24 rotates, the plasma track follows the instantaneous position of the rotating magnet assembly and sputters areas of the target. Important characteristics of the source performance, including the volume of erosion through target life and depositional thickness uniformity on the substrate 10, depend on the detailed shape of the plasma track.

The present invention provides rotating magnet sputter sources that have a broad erosion pattern and relatively small source-to-substrate distances for extended target life. The sputter sources of the invention also have good depositional thickness uniformity on the substrate. Good depositional thickness uniformity is typically less than ±5% and preferably less than ±3%.

It is useful to define the term "inventory" as used in the disk coater business to quantify the total thickness that can be deposited on substrates during target life. The units are usually millions of angstroms (M Å). For chromium, where the film thickness on each substrate is relatively large, desirable inventory can be more than 15 M Å and preferably more than 18 M Å.

According to one aspect of the invention, a method for configuring rotating magnet sputter sources that have the above desirable characteristics is provided. The basis of the method is to define, typically by iterative optimization techniques, a target erosion profile that is calculated to yield a desired depositional thickness distribution. A plasma track shape is then generated that is predicted to produce the optimized target erosion profile to sufficient accuracy. A magnet structure is then designed to produce the desired track shape. The plasma track design utilizes magnetostatic modeling software such as "Amperes" (Integrated Engineering Software, Winnipeg, Canada).

Figure 2:
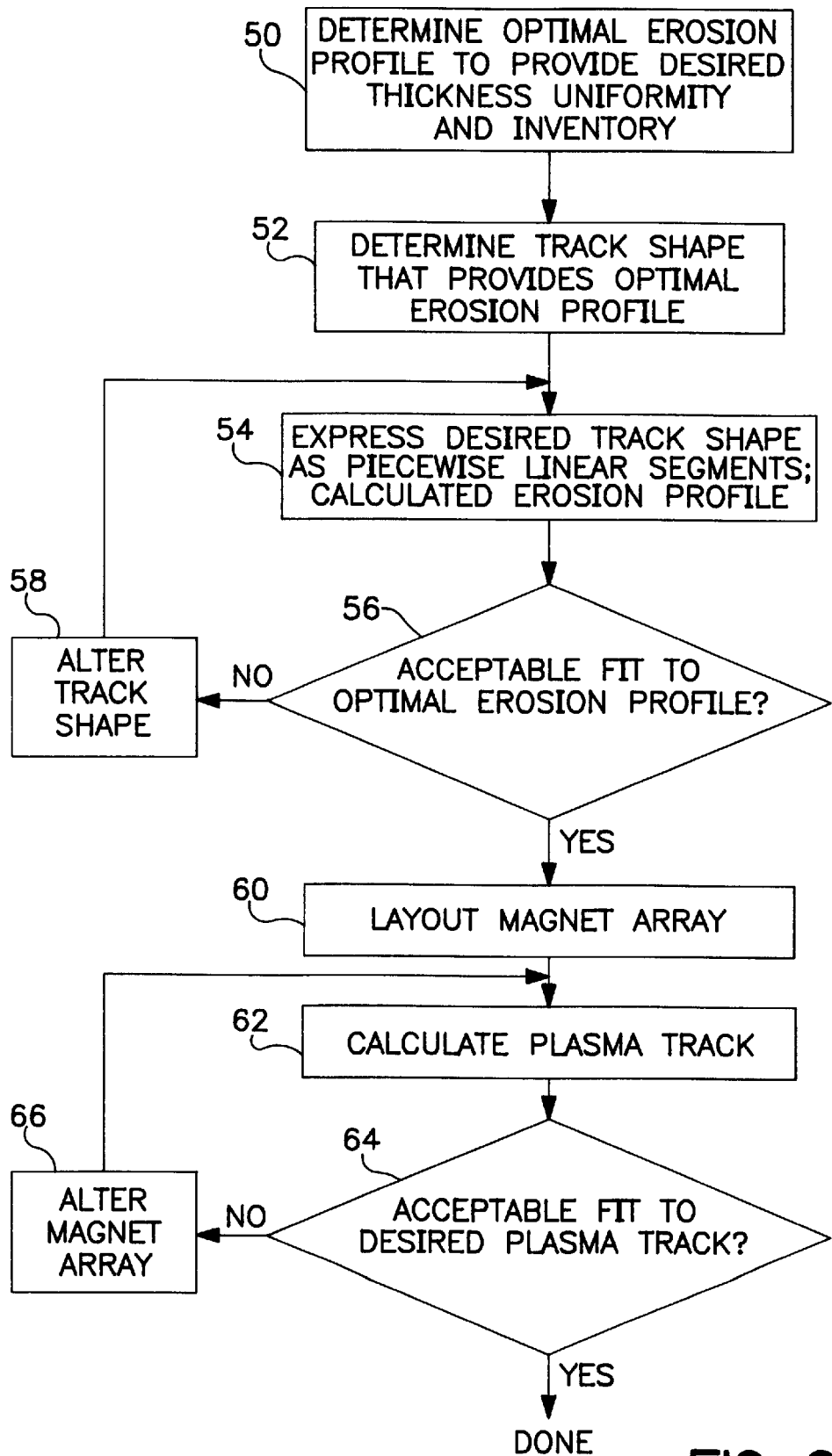
FIG. 2 is a flow diagram that illustrates the process for configuring a rotating magnet structure in accordance with the invention.

The design method is illustrated in the flow diagram of FIG. 2. The foundation of the design method is to determine an optimal erosion profile subject to the condition that it produce approximately a desired depositional thickness uniformity on a substrate located a known distance from the target surface (step 50). A prescribed inner diameter of the erosion profile, a prescribed outer diameter, and a fixed target-to-substrate distance also constrain the erosion shape. The proper plasma track to achieve the optimal erosion profile is inferred from the erosion profile.

Stable methods of solving Fredholm integral equations of the first kind are discussed by Delves and Mohamed in Chapter 12, "Integral Equations of the First Kind" of *Computational Methods for Integral Equations*, Cambridge University Press (1985). An example of this type of equation is as follows:

$$\int_a^b K(r,r')e(r')r'dr' = t(r) \qquad (1)$$

This equation has the same form as the equation for expressing the depositional radial thickness distribution $t(r)$ in terms of the target erosion profile $e(r')$ and a known modeled function $K(r,r')$. The symmetry is purely azimuthal, with only radial dependence. The lower limit a and upper limit b are fixed values equal to the extent of erosion. In solving equation (1), the thickness distribution $t(r)$ and the limits (a and b) are specified. The function $K(r,r')$ can be modeled to sufficient accuracy, as discussed below, and $e(r')$ is to be determined.

The unknown erosion profile $e(r')$ is expressed as a finite linear expansion to convert the integral equation into a set of linear algebraic equations $$e(r') = \sum_0^N a_n T_n(s) \qquad (2)$$

The variables r' and s are linearly related so as to bring the argument of $T_n$ into the required range of definition. The expansion has N+1 terms, coefficients $a_n$ are to be determined, and functions $T_n$ are the first N+1 members of a complete set of functions (typically orthogonal polynomials). The functions $T_n$ were selected to be Chebyshev polynomials, because these functions are robust curve fitters. The argument of Chebyshev polynomials is defined to be $-1 \leq s \leq 1$, so that the linear relation between s and r' is $$s = \frac{2r' - (b+a)}{(b-a)} \qquad (3)$$

The value of N must be sufficiently large to give good accuracy in representing the solution. A value of N=20 is usually sufficient. Software for solving equation (1) incorporates a bounding method for the coefficients $a_n$ described by Delves and Mohamed as an aid to stability. Delves and Mohamed also point out that for stability the algebraic equations should be solved not directly, but by minimization (equivalently, optimization). The work of the optimizer is to choose the coefficients $a_n$ so as to make left and right hand sides of the integral equation as equal as possible. The software preferably uses a version of the downhill simplex optimizing method (AMOEBA) discussed by Press, et al. in *Numerical Recipes*, Cambridge University Press, 1986, 1992. The AMOEBA optimizer proceeds by iteration, gradually making the left hand side of the integral equation as close to the specified right hand side as possible.

Because inventory tends to decrease as thickness uniformity improves, the software stops at every 50 iterations and calculates the uniformity and inventory based on the current erosion shape. The program is terminated when the uniformity and inventory have both reached acceptable values. Calculation of inventory is discussed below.

During iterational optimization, it may happen that the expansion for the erosion shape has a different algebraic sign for some radius or range of radii, which is not allowable physically. This is a global effect, depending on the behavior of the whole series expansion, and cannot be prevented by conditions on the coefficients $a_n$. An algorithm incorporated into the software as a subroutine prevents this from happening. After a chosen predetermined number of iterations, typically 10, the current erosion profile is calculated from equation (2) and examined by the software to determine if a change of sign has occurred anywhere. If so, the erosion profile in the offending regions is set to zero and the new modified profile, now of one sign, is fit to a Chebyshev series using the inverse of equation (2) according to methods familiar to those skilled in the art. This procedure generates a new modified set of the coefficients an, which are then used to reinitialize the optimizer for the succeeding iterations. In practice, this algorithm keeps the erosion profile of one sign to typically within 1% of the maximum erosion.

The iterative optimization process provides an optimal erosion profile suitable for the given source-to-substrate distance and specified inside diameter and outside diameter of the erosion region (the inside diameter can be 0). The erosion profile is also determined during the iterative optimization process to have a satisfactory thickness uniformity and a satisfactory inventory, insofar as this is possible under the specified conditions.

A plasma track is then designed that is predicted to provide the optimal erosion pattern, to satisfactory accuracy (step 52). The design of the plasma track uses the fundamental principle that the rate of erosion at a given radius is proportional to the angle subtended by the plasma track arc at that radius. For example, to obtain substantial erosion at a large radius, as much plasma track length as possible is placed at or near that radius. As another example, to extend the plasma track from a larger radius to near the center without having excessive erosion at small radii, the plasma track is made radial or nearly radial to minimize the subtended angle.

As an analysis tool in track development, the tentative track shape is expressed as piecewise linear segments (step 54). Typically, the segment length is 1.5 to 2.0 millimeters, so that there may be 100 or more segments describing half the plasma track. The plasma track is preferably symmetric, and only half of the track is analyzed. A computer program calculates the predicted erosion, assuming for the plasma track a constant Gaussian width of chosen full width at half maximum (FWHM). The best value of FWHM is chosen with reference to measurements of the groove shape from static erosion tests using plasma tracks of similar shape. Although the FWHM is observed experimentally to vary somewhat along the plasma track, the constant FWHM approximation has proved to be acceptable in practice.

If the predicted erosion pattern is determined in step 56 not to be sufficiently close to the optimal erosion profile over certain radii, the shape of the tentative plasma track is altered over those radii in step 58 by manipulating the location and orientation of the appropriate segments. The result may not fit the optimal erosion profile perfectly, so it is checked by calculating the predicted thickness uniformity and inventory. In practice, a reasonably good fit to the optimal erosion profile usually yields good predicted uniformity and inventory. Small discrepancies from the optimal erosion profile do not appear to be critical. As a secondary condition, the plasma track is manipulated so that it predicts some erosion in the central region of the target.

Figure 4:
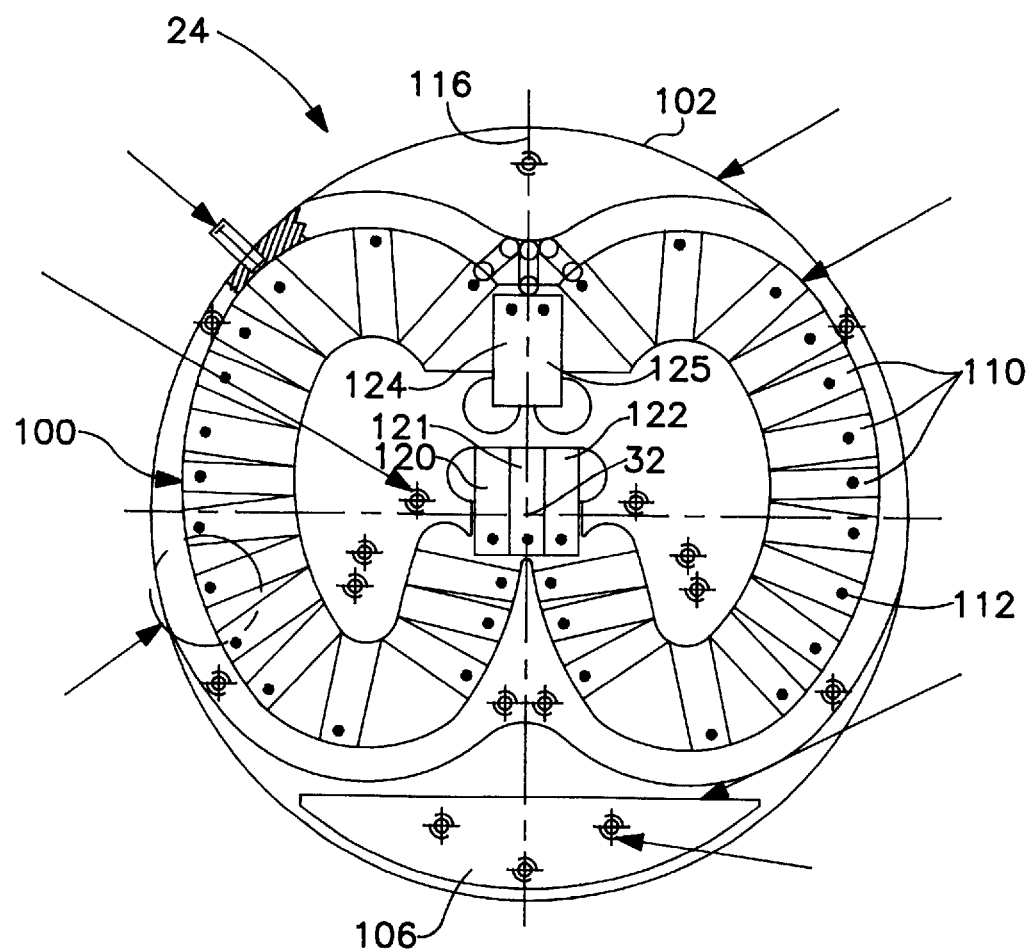
FIG. 4 is a plan view of a first embodiment of a rotating magnet assembly in accordance with the invention.

The final task is to design a magnet array that gives the desired plasma track shape at the target surface. The magnet array preferably comprises a series of magnet bars positioned along the plasma track so as to produce the desired plasma track shape. As a zero order approximation, the plasma track at the target surface is assumed to lie immediately above the center line of the magnet bars. Three-dimensional magnetic modeling has shown that the plasma track tends to expand outward, increasing with the gap between the top of the magnet array and the target surface. Thus, the first approximation is to move the magnet bars inwardly so that their centerlines lie within the centerline of the desired plasma track. In typical applications, this distance may be 2 to 8 millimeters. The magnet bars are then placed on the trial magnet center line produced by contraction in such manner, typically so that each magnet bar is locally perpendicular or nearly perpendicular to the trial magnet structure center line, and typically so that one magnet bar nearly touches a corner of its neighbor (step 60). The trial magnet array geometry is then entered into the 3-D modeling program, and the field at the target surface is calculated (step 62). The predicted plasma track on the target surface is characterized as the locus where the axial magnetic field goes through zero. The predicted plasma track is then compared with the desired plasma track (step 64). In a second approximation, the magnet bars are moved to decrease these discrepancies (step 66). The necessary movements are typically only a few millimeters. The process may be repeated, but in practice two to four trials are usually sufficient to obtain a predicted plasma track that provides satisfactory depositional thickness uniformity and inventory. In certain problem areas, typically near the center of the target, it may be necessary to provide magnet bar arrangements which depart from the systematic plan described above. For example, as shown in FIG. 4, three magnet bars 120, 121 and 122 are placed near the center of the rotating magnet assembly. Although the optimal erosion pattern and the desired plasma track shape may not be achieved perfectly, a close approximation provides satisfactory performance.

In a typical sputter coater for magnetic disks, two sputtering sources are arranged in facing opposition, so that both sides of a substrate can be coated simultaneously. The 3-D magnetic modeling program permits the effect of the second sputtering source to be included by reflection anti-symmetry. The magnetic field of one source acts at the target surface of the other in such a way as to draw the track inwardly toward the axis of rotation, especially near the center. A single source alone may not exhibit erosion fully across the center region, whereas two sputter sources arranged in facing opposition provide erosion across the center region of the target if they have been designed to do so in accordance with the invention.

The function $K(r, r')$ which appears in equation (1) includes various geometric and physical factors as discussed below. The coordinate system is cylindrical, with the z axis along the axis of rotation 32. In the integral equation, variable r is the radial distance on the substrate plane and variable r' is the radial distance on the initial target surface. The plane containing the front surface of the substrate 10 (FIG. 1) and the plane containing the initial front surface 26 of the target 22 are assumed to be parallel and perpendicular to the axis of rotation 32, as suited to the cylindrical symmetry of a rotating magnet source. In addition, the substrate is assumed to be cylindrically symmetrical.

Figure 3:
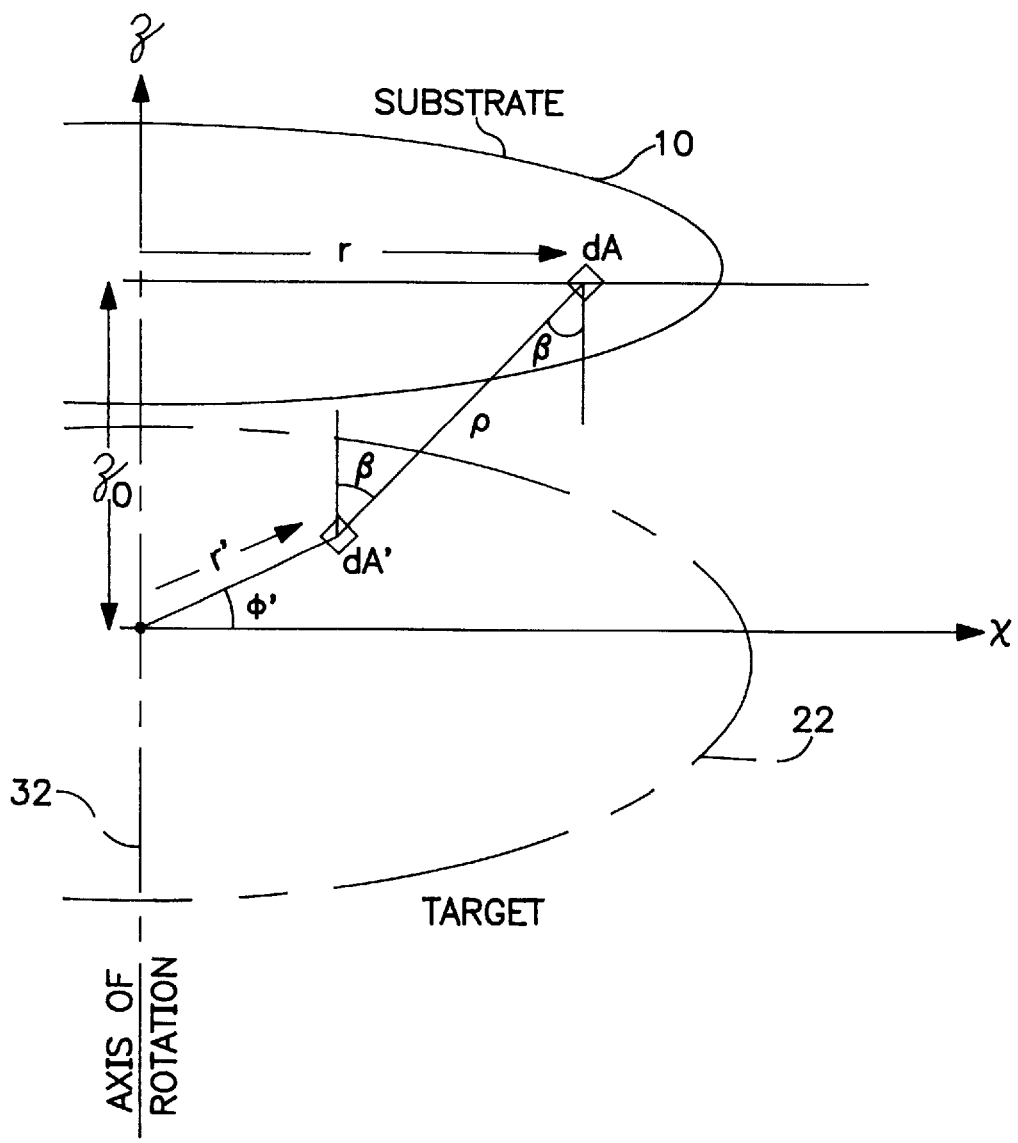
FIG. 3 is a schematic diagram showing the geometrical parameters involved in calculating the erosion profile on the target.

The geometry is shown in FIG. 3. The distance between the target plane and the substrate plane is called the source-to-substrate distance $z_0$. A narrow bundle of sputtered atoms is emitted from an area element dA' on the target 22. The bundle is chosen to be those atoms that would, in straight line motion, reach an area element dA on the substrate 10. The distance from area element dA' to area element dA is $\rho$, where $$\rho^2 = r^2 + r'^2 + z_o^2 - 2rr'\cos\phi' \tag{4}$$

The angle $\phi'$ is the azimuthal angle of area element dA'. Because of the cylindrical symmetry, it is sufficiently general to place the receiving area element dA on the x axis, as shown in FIG. 3.

The relative number of atoms reaching area element dA per unit area is proportional to the inverse square of distance $\rho$, and is proportional to the emitting area element dA'. Thus $K(r, r')$ depends on the combination $$\frac{dA'}{\rho^2} = \frac{d\phi' r' dr'}{\rho^2} \tag{5}$$

A second fundamental geometric factor entering into $K(r,r')$ is the cosine of angle $\beta$ between the normal to the substrate and the line between area elements dA and dA'. This projection factor takes into account the spreading of the ray bundle due to non-normal incidence. From the relation $\cos \beta = z_0/\rho$, it can be seen that $\cos \beta$ depends on the azimuthal angle $\phi'$ through $\rho$. The total contribution to $K(r,r')$ is found by integrating over the azimuthal angle from 0 to $2n\pi$.

$$K(r,r') = z_0 \int_0^{2\pi} [\text{depends on } \phi'] \frac{d\phi'}{\rho^3} \tag{6}$$

The r'dr' portion of the area element is included separately in equation (1). The function $K(r,r')$ is normally written so as to be symmetric in r and r'. The term in square brackets in equation (6) represents other possible factors that may depend on $\phi'$. From this understanding of the meaning of $K(r,r')$, the appearance of the erosion profile $e(r')$ in equation (1) is seen to represent a weighting factor on the relative emission per unit area from the target at radius r'.

Experiments have shown that in general sputtered atoms are not emitted isotropically, leading to a dependence on the emission angle $\beta$ that may be included in the expression for $K(r,r')$. Detailed knowledge of the angular emission distribution is usually not available for the specific deposition conditions of interest, and direct experimental measurement is complex and difficult. Therefore, models of $K(r,r')$ usually include the angular distribution as an empirical factor. The empirical factor $\cos^n \beta$, where n is typically between 0 and 1, may be used. The case n=0 corresponds to isotropic emission. Based on limited experiments, small values of n appear to apply to large source to substrate distances (roughly, $n \approx 0.1$ for $z_0 \approx 30$ mm), with larger values of n for smaller source-to-substrate distances (roughly, $n \approx 0.6$ for $z_0 \approx 10$ mm). However, results do not appear to be sensitive to the value of n chosen, and rough values are sufficient. The emission factor goes into the square brackets in equation (6), because of the dependence of $\beta$ on $\phi'$. With $n \approx 0$, the integral cannot usually be expressed in closed form, and numerical integration must be utilized. Sixteen point Gaussian quadrature over 0 to $\pi$ may be employed.

As the sputtered atom travels from the emission point to the receiving point, there is a probability that it may suffer a large angle scattering collision with a sputter gas atom (usually argon). Such collisions deflect the sputtered atom from its straight line path and in principle require further corrections to the function K (r,r'). A typical approach would be through Monte Carlo methods, which require test of a large number of random trajectories as they are modified according to the known scattering cross section with argon atoms. A conservative rule of thumb is that gas scattering effects will not be important if the estimated mean free path for scattering at the operating pressure is longer than a typical value of ρ. Gas scattering effects may be neglected for sources that operate at low gas pressures (typically 1–5 millitorr) and for moderate source-to-substrate distances (typically 25–35 mm). Under these conditions, the mean free path tends to be larger than the relevant source-to-substrate geometry. Data presented in *Physical Vapor Deposition,* R. Hill ed., Temescal, published by the BOC Group, Inc., suggest that in sputtering at typical source-to-substrate distances of 25–50 millimeters, gas scattering is not a large effect for pressures below 5 to 10 millitorr.

The magnetic field in the vicinity of the plasma track may vary along the track, due to design and magnet placement. Because the magnetic field provides electron trapping, the rate of emission at a given small region of track in principle depends on the local magnetic field. Averaged over rotation, this effect would introduce a radial factor into the function K(r,r').

The dependence of sputtering rate on magnetic field strength is not believed to be understood in detail. Generally, a weak magnetic field will produce poor electron trapping, and the emission will be low. An extremely large field makes the confined electrons move in cycloidal loops with diameters smaller than the thickness of the cathode sheath, so the electrons do not gain maximum possible energy. Thus, the sputtering rate tends to be low if the field is too large or too small. In the preferred approach, the magnetic field along the plasma track is moderate in strength and does not vary excessively, so corrections for variations of magnetic field along the plasma track are not included in the function K(r,r').

Prior art sputtering source designs typically used target utilization as a figure of merit. Target utilization is measured as the ratio of target weight at the time of replacement to initial target weight. However, material eroded from the target does not necessarily result in deposition on the substrate. A substantial fraction of the material ends up on the surrounding shields and does not contribute to the finished product. The disk manufacturer is more directly concerned with the number of disks that can be coated to a certain thickness before target replacement is required. Target change causes loss of production due to machine shutdown, so a long period of operation from each target is desirable.

A more realistic figure of merit is inventory, which is defined as the total coating thickness on substrates during the life of the target. Inventory is a combination of amount of material eroded from the target, together with collection efficiency, which is the fraction of sputtered atoms that are actually deposited on the substrate. Small source-to-substrate distances promote higher collection efficiency.

As a conservative rule of thumb, a target is ready for replacement when the depth of erosion at any radius reaches 90% of the initial target thickness. To estimate inventory from calculated erosion, the radius corresponding to maximum erosion depth is found. The relative depth is converted to a true depth by normalizing it to 90% of the initial target thickness. Then the volume V of material eroded from the target is estimated by integrating the normalized erosion profile.

$$V = 2\pi \int_a^b e(r')r'dr' \tag{7}$$

The volume V is then multiplied by the collection efficiency c to give the total volume of material collected by substrates during target life. To find collection efficiency c, the relative amount of material collected by the substrate is found by integrating the relative deposited thickness t(r) over the substrate area. The deposited thickness t(r) is then divided by the total collection, which is the amount of material collected on a hemisphere of radius much larger than the target size. Finally, dividing V×c by the area of the substrate gives the estimated collected thickness, i.e., the inventory. Inventory is typically expressed in units of millions of angstroms (M Å).

In the prior art with magnetron sources producing erosion in a narrow ring, inventory for a 0.25 inch thick target was often less than 5 M Å. This was partly due to the narrowness of the erosion groove and partly due to the fact that the source-to-substrate distance was fairly large, making collection efficiency small (typically about 15%). In the prior art, it was necessary to have a fairly large source-to-substrate distance, because acceptable thickness uniformity was achieved with ring sources only if the source-to-substrate distance was comparable to the ring radius. The ring radius must be comparable to the substrate radius to give good uniformity up to the substrate outside diameter.

For the sputtering source of the present invention, measured inventory for a 0.25 inch thick chromium target is approximately 16.5 M Å. The corresponding collection efficiency is calculated to be about 25%. A major reason for these improved values in accordance with the invention is that the sputtering source is designed to give good thickness uniformity over the whole substrate at small source-to-substrate distances.

Figure 15:
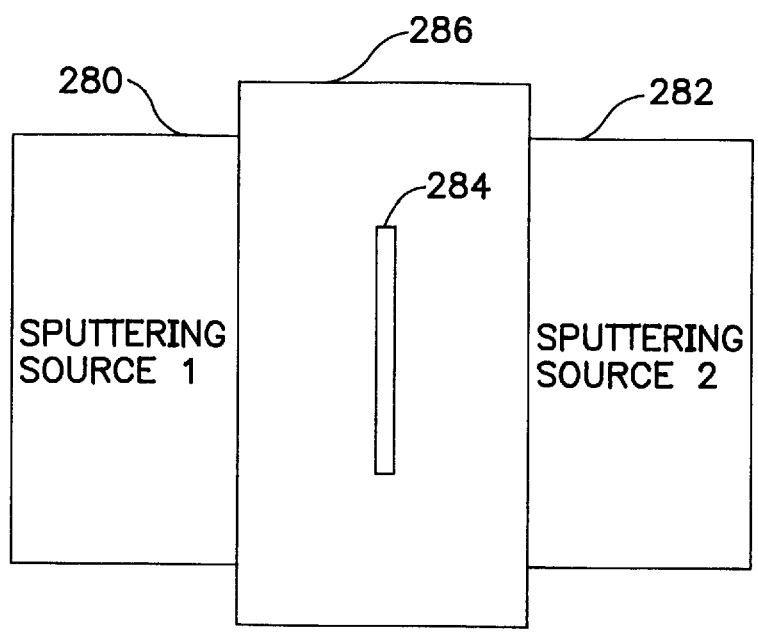
FIG. 15 is a block diagram of a sputter coating system having two opposed sputtering sources.

In disk coater technology, each deposition station typically includes two opposed sputtering sources 280 and 282, as shown in FIG. 15. The substrate 284 is placed in a vacuum process chamber 286 midway between the opposed targets of sputtering sources 280 and 282 to give higher throughput in terms of number of disks coated per hour. Both sides of the substrate 284 are coated simultaneously by operating both sputtering sources 280 and 282. The axial field produced by one rotating magnet assembly at the surface of the opposed target (the secondary field) is not negligible for source-to-substrate distances of 30 mm. The secondary axial field in the plasma track region is of the order of 40 to 100 gauss in magnitude. The contours of constant axial field are nearly circular, indicating that the secondary axial field at a given point does not change significantly during rotation of the primary sputter source. The secondary field components perpendicular to the axis of rotation tend to be small and tend to cancel on the average during rotation.

Over the area covered by the plasma track, the direction of the secondary axial field at large distances from the primary source is toward the producing source, assuming that the magnet bars are oriented with the north poles outward from the track. All directions are reversed if the magnet bars are oriented with the north poles inward. For the model of mutual interaction discussed, the secondary field is taken to be axial, inward toward the primary producing source and constant in magnitude at the opposing target surface. The centerline of the plasma track occurs at the target surface where the axial primary field changes direction and passes through zero. When the axial secondary field is added to the axial primary field, taking proper account of direction, the net upward axial fields at any point on the target surface are larger than before, and the net downward axial fields are less than before. The result is that the zero crossing is moved inward, toward the axis of rotation. Thus, using two sputtering sources in opposition draws the plasma track in toward the axis of rotation, so that the central region is eroded if the sources have been designed to do so in accordance with the invention. One source acting alone may not be able to cause full erosion across the central region. It will be understood that in sputter coating systems which use a single sputtering source, the erosion profile can be adjusted to ensure at least some sputtering over the central region of the target. If the two sputter sources have opposite magnet bar polarity, the track will tend to be expanded and performance is degraded.

An example of a rotating magnet assembly 24 in accordance with the invention is s shown in FIG. 4. The rotating magnet assembly 24 includes a magnet array 100 mounted on a nonmagnetic base 102, which may be fabricated of aluminum. In operation, the rotating magnet assembly 24 rotates about axis of rotation 32, typically at a speed of about 600 rpm, to produce an erosion profile on the sputter target as described above. A counterweight 106 may be mounted on base 102 to ensure balanced rotation of assembly 24.

The magnet array 100 preferably includes a plurality of magnet bars 110 mounted on base 102 in a configuration which produces a desired plasma track as described above. A dot 112 on each magnet bar indicates its north pole. In the example of FIG. 4, the magnet bars 110 comprise neodymium-iron-boron permanent magnets having a magnetic energy product of 38–45 MGO. The magnet array 100 is preferably symmetrical with respect to a line 116 that passes through axis of rotation 32. The magnet bars 110 are preferably positioned with all the north poles outwardly of the plasma track, or all the north poles inwardly of the plasma track. A given choice should be followed consistently if two sources are to be used in opposition. Along most of the plasma track, the magnet bars 110 are in contact at their inside edges and are spaced apart at their outside edges to achieve the desired plasma track shape. Exceptions to this general rule include magnet bars 120, 121 and 122 located side by side on axis of rotation 32 and magnet bars 124 and 125 located side by side on a cusp of the plasma track.

Figure 5:
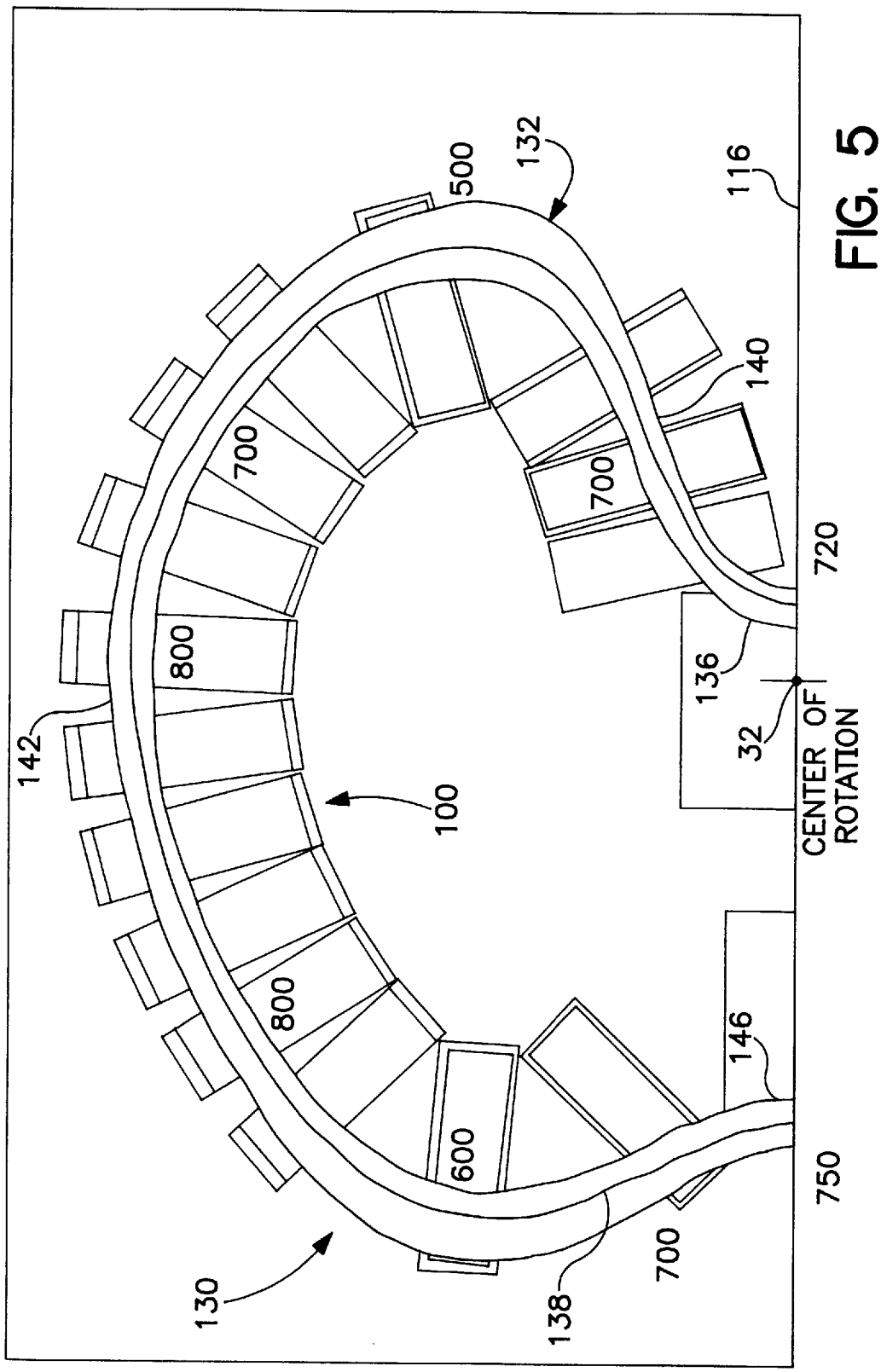
FIG. 5 is a schematic plan view of one half of a plasma track in accordance with the first embodiment of the invention.

One half of a plasma track 130 that is representative of rotating magnetic sputter sources in accordance with the invention is shown in FIG. 5. The plasma track 130 preferably includes two lobes that are symmetrical with respect to line 116, a deeply indented inward cusp 136 located near axis of rotation 32 and a smooth, moderately indented inward cusp 146 located at the far end of the lobes with respect to cusp 136. Thus, cusps 136 and 146 are located on opposite sides of plasma track 130. One lobe 132 of the two lobes of plasma track 130 is shown in FIG. 5. The other lobe is symmetrical with respect to line 116. The plasma track 130 is overlaid on one half of magnet array 100, shown in FIG. 4 and described above. The plasma track 130 is shown as it would be on the target front surface 0.75 inch above the tops of the magnet bars. The source-to-substrate distance is 25 millimeters, and the target is assumed to be nonmagnetic. The lighter shaded area represents values of axial magnetic field between −75 gauss and 0 gauss at the target surface, and the darker shaded area represents values of axial magnetic field between 0 gauss and +75 gauss at the target surface. The center line of plasma track 130 follows a boundary 138 between the light and dark shaded regions, which is equivalent to the contour where the axial magnetic field is zero. The example shown in FIG. 5 assumes two opposing sputter sources, as they would be in a standard disk coating station. Thus, the plasma track shown takes into account the contribution of the opposing sputter source. The position on cusp 136 where the plasma track intersects line 116 is approximately 6 to 7 millimeters from axis of rotation 32. This is sufficiently close to ensure erosion over the entire central region of the target, taking into account that the track width is reasonably well described as Gaussian with an FWHM of 10 to 12 millimeters. The cusp 136 is produced by a plurality of magnets, including magnet bars 120, 121, 122 in the central region of the rotating magnet assembly, together with an axial field supplied by a second opposing source as described above. A section 140 of lobe 132 is radial or nearly radial. A relatively long section 142 that is approximately 100° in angular extent with respect to axis 32 has a relatively large radius such that the plasma track at the target surface has a radius that is nearly constant within about 10%. The cusp 146 is located at the far end of lobe 132 with respect to axis 32 and is produced by magnet bars 124 and 125. The plasma track 130 has a relatively small size in comparison with prior art rotating magnet structures. In particular, the plasma track 130 has a maximum radius of 59 mm, whereas prior art magnet structures typically have a maximum radius on the order of 115 mm.

The example of the rotating magnet assembly shown in FIG. 4 and described above was designed to be used in sputter deposition of magnetic memory disks. In this application, the disks are annular with 25 millimeters inside diameter and 95 millimeters outside diameter. The coatings are chromium, magnetic alloy and carbon, in that order. The target diameter is 6 inches. A solid circular target with no center hole is used, because the sputter source of the present invention produces erosion across the central region of the target. The target has a flat surface facing the substrate. The outer rim of the target is clamped to a water cooled heat sink. The edge of the clamp does not intrude more than 1.2 millimeters on the target radius. A flat, grounded sputter shield spaced above the clamp ring prevents the clamp ring material from being sputtered. Furthermore, the maximum radius of erosion does not extend to the clamp ring. The target thickness is of the order of 0.25 inches for chromium and 0.13 inches for carbon. The carbon target is normally not clamped directly to the clamp ring. Instead, the carbon target is bonded to a metal backing plate, and the plate is clamped to the heat sink. For nonmagnetic targets, such as chromium and carbon, the source-to-substrate distance is typically 30–35 millimeters. The outer clamp ring is made from nonmagnetic material when nonmagnetic targets are used.

For magnetic alloy targets, such as used for the magnetic layer in hard disk manufacture, the configuration is different because the target now forms part of the magnetic structure. The source-to-substrate distance is typically 40–45 millimeters. The outer clamp ring is ferromagnetic, and the target cooling device is thinner than for nonmagnetic targets to strengthen the field at the target. In some applications, the magnetic alloy target is thinner than 0.25 inch, to promote magnetic flux penetration.

Figure 6:
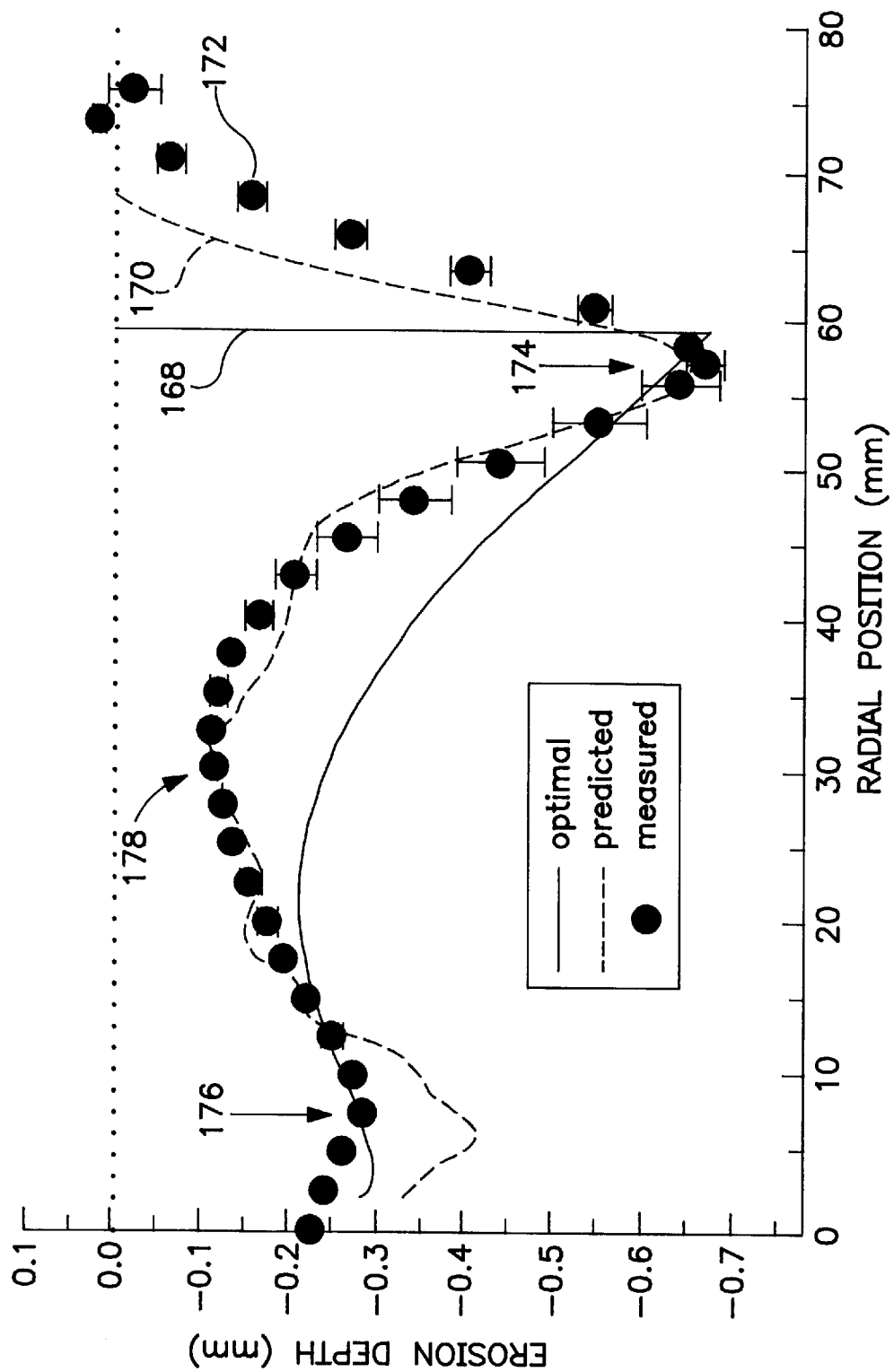
FIG. 6 is a graph of erosion depth as a function of radial position for a copper target, showing optimal, measured and predicted erosion profiles.

FIG. 6 shows optimal, measured and predicted erosion profiles for a copper target in a sputter coating station with two opposed sputtering sources. Erosion depth is plotted as a function of radial distance from the target center. Curve 168 indicates the ideal optimized erosion profile, curve 170 indicates the predicted erosion profile, and curve 172 indicates the measured erosion profile. The predicted curve 170 and the measured curve 172 are normalized to the measured maximum depth of erosion. The predicted curve is based only on a knowledge of the magnet structure of the sputter source, together with a best fit estimate of the plasma track width. Because of the discrete nature of the piecewise linear model (discontinuous first derivative between segments), the calculated points for the predicted curve 170 have been subjected to a three-point averaging for smoothing. The erosion profiles shown in FIG. 6 are characterized by a relatively deep first circular groove 174 near the outer periphery of that target, a relatively shallow second circular groove 176 near the center of the target and an intermediate region 178 between the first and second grooves. The intermediate region 178 has a shallower erosion depth than the first and second grooves. The generally good agreement between the measured and predicted erosion profiles is considered to validate the modeling approach.

A sputtering source in accordance with the invention has been tested with chromium, carbon and magnetic alloy targets as used in disk coating. The source gave measured thickness uniformities better than ±5%, and often better than ±3%. The sputter source sputtered all three target materials completely across the target surface including the center, almost up to the outer target clamp. Thickness data shown in FIGS. 7–9 were, for each target material, taken when the target was new (0 kWh), and near the end of target life (different for different materials). The setup for the target life test was a typical sputter coating station with two opposed sputtering sources. The targets on each source were the same material. The substrates were typical hard drive annular aluminum disks with an inside diameter of 25 millimeters and an outside diameter of 95 millimeters. The sources were cycled on and off in a manner to simulate operating conditions in an actual production coater. From time to time, a thickness sample was run by depositing on a fresh substrate. The same power and same deposition time was used for the thickness samples for all materials. All thicknesses are averages over 12 points at each measurement radius (15 millimeters, 30 millimeters and 45 millimeters). The data for the end of target life are displaced by 0.5 millimeter for clarity in FIGS. 7–9. It will be understood that the deposition times for the thickness samples were much longer than in production coating, in order to provide films sufficiently thick for more accurate thickness measurements in a stylus profilometer.

Figure 7:
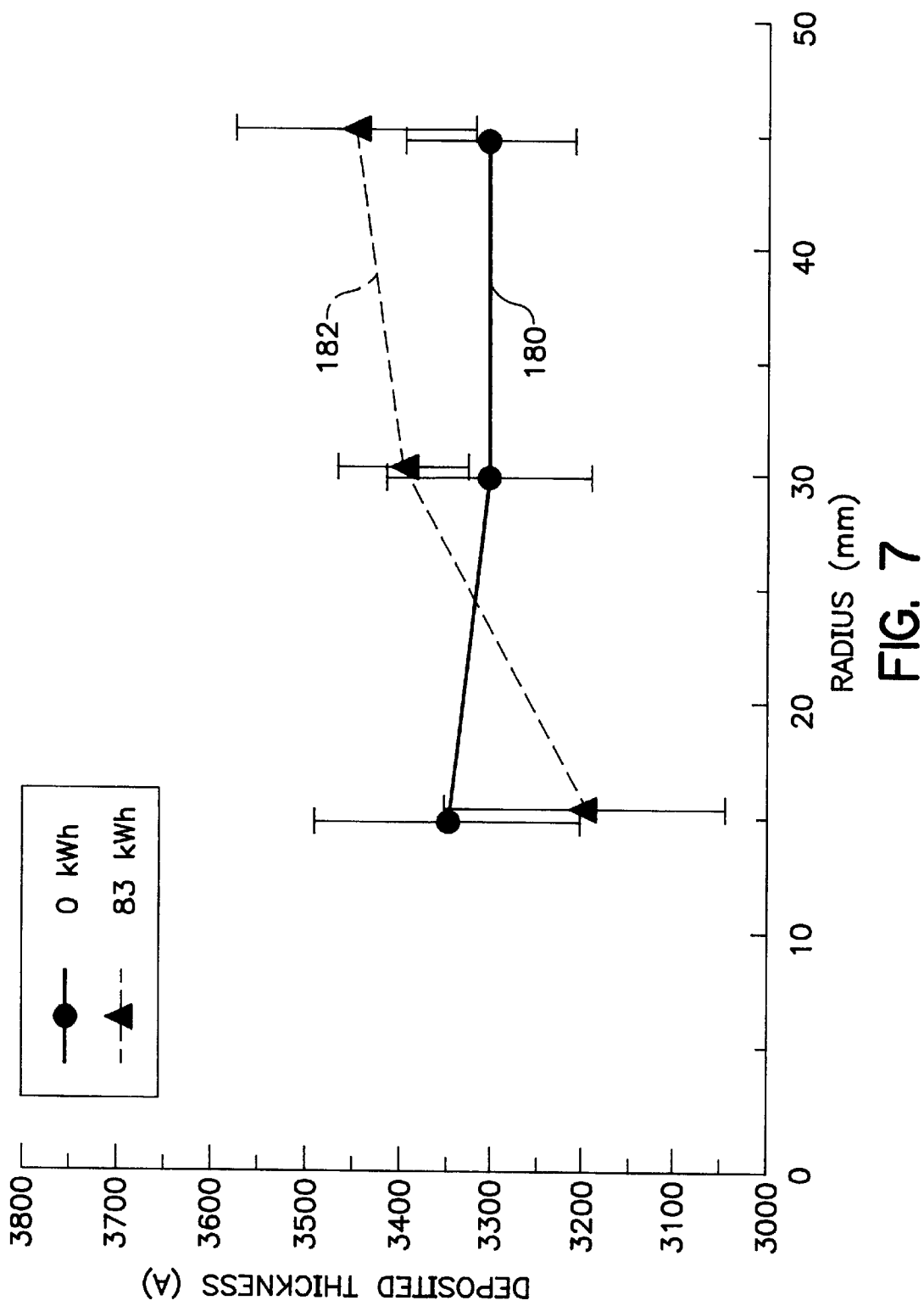
FIG. 7 is a graph of deposited thickness as a function of radius for a chromium target.

The deposited thickness using a chromium target is plotted in FIG. 7 as a function of radius. The source-to-substrate distance was 33 millimeters for both sources. The thickness uniformity is better than ±2% at the beginning of target life (curve 180) and ±4% at the end of target life (curve 182). The close agreement between the two curves in thickness shows that the rate of deposition varied hardly at all during target life.

The initial thickness of the chromium target was 0.25 inch. At the end of target life, the target had supplied an estimated total inventory of 16.5 M Å. For typical film thicknesses and typical production conditions of 450 disks coated per hour using two chromium stations, this corresponds to more than 140 hours of continuous production before target change.

Figure 8:
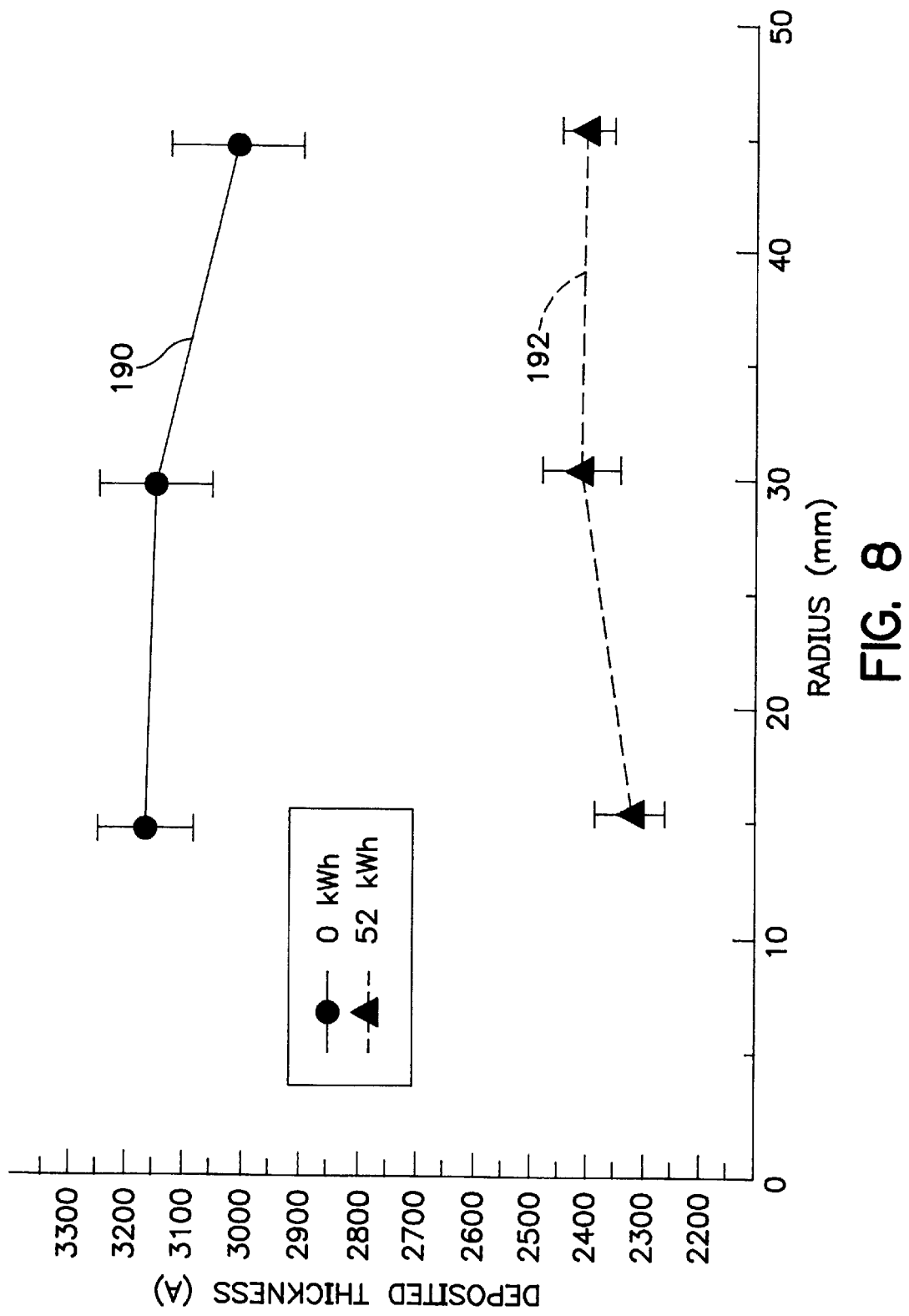
FIG. 8 is a graph of deposited thickness as a function of radius for a magnetic alloy target.

The deposited thickness using a magnetic alloy target is plotted in FIG. 8 as a function of radius. The magnetic alloy used in these tests was Co:Cr12:Ta2 HPTF (high pass through flux),a material of lower bulk permeability than standard magnetic alloy. The source-to-substrate distance was 42 millimeters for both sources to help counteract the tendency for the relative thickness to increase at the substrate outside diameter during target life. The thickness uniformity remained better than ±4% during target life. The displacement between curve 190, taken at the beginning of target life, and curve 192, taken at the end of target life, shows that the rate of deposition decreased during target life. In production this would be compensated by some combination of higher applied power and longer deposition time.

The initial thickness of the magnetic alloy target was 0.16 inch, to minimize the effect of the target's permeability on the plasma track. At the end of target life, the target had supplied an estimated total inventory of 8.8 MA. For typical film thicknesses and typical production conditions of 450 disks coated per hour using two magnetic alloy stations, this corresponds to more than 160 hours of continuous production before target change.

Figure 9:
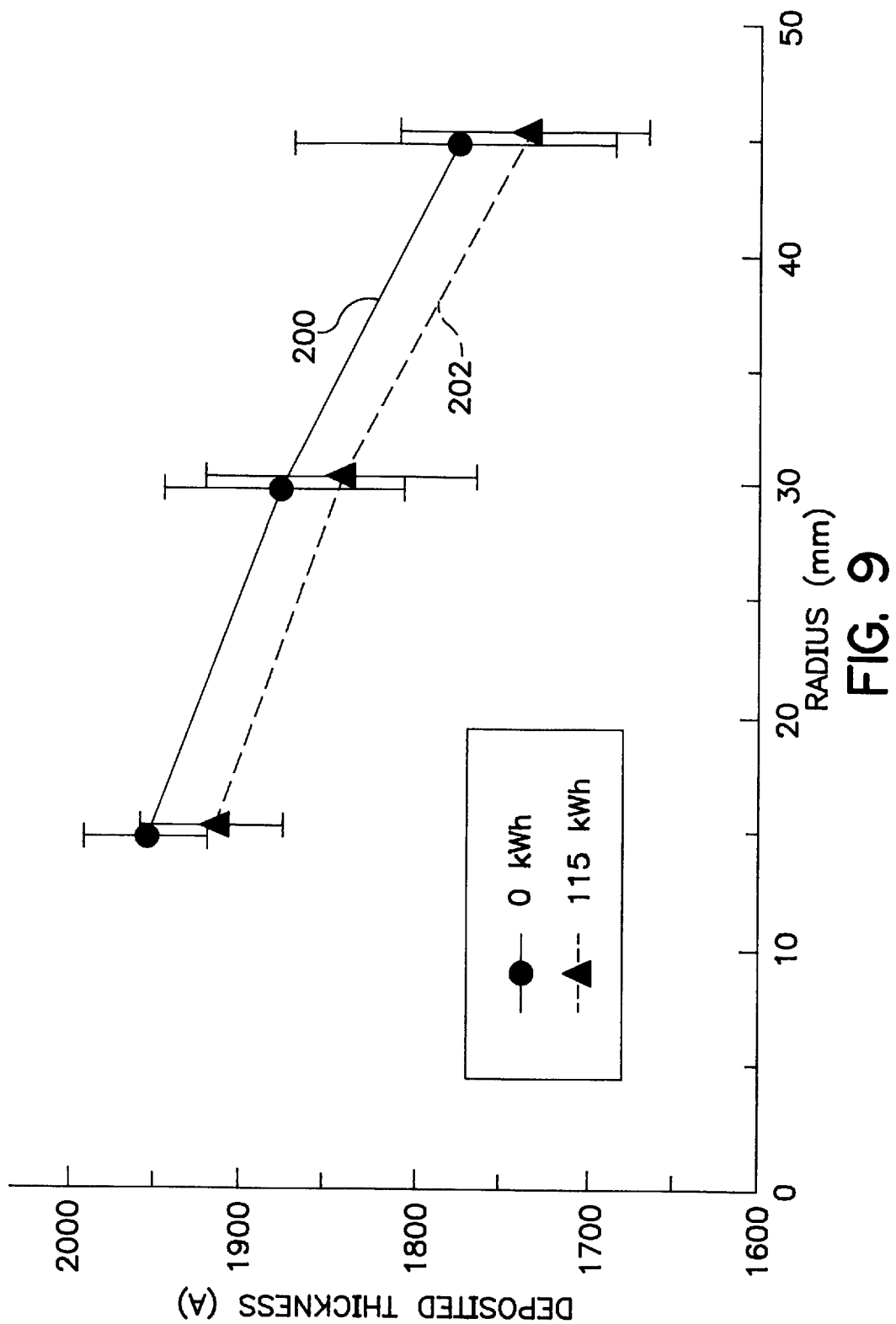
FIG. 9 is a graph of deposited thickness as a function of radius for a carbon target.

The deposited thickness using a carbon target is plotted in FIG. 9 as a function of radius. Curve 200 represents thickness uniformity at the beginning of target life, and curve 202 represents thickness uniformity at the end of target life. The source-to-substrate distance was 30 millimeters. The thickness uniformity remained better than ±5% over the target life. However, the roughness of the carbon film increased the measurement error with the stylus profilometer. The sample thicknesses made under standard conditions are much less than for the other materials, due to the lower sputtering yield for carbon. Curves 200 and 202 are close together, showing that the rate of deposition varied hardly at all during the test run.

The initial thickness of the carbon target was 0.13 inch. At the end of the run, the target was estimated to have exhausted only one half of its total projected life. At this point, the target had supplied an estimated total inventory of 4 M Å. For typical film thicknesses and typical production conditions of 450 disks coated per hour using three carbon stations, this corresponds to more than 160 hours of continuous production before target change after one half of the target life.

Carbon targets are prone to form nodules on the surface during sputtering. The nodules are poorly conducting and can act as focal points for arc formation, with consequent spray of undesirable particulates onto the substrate. During the test described above, only one nodule was observed on one of the two carbon targets.

Figure 10:
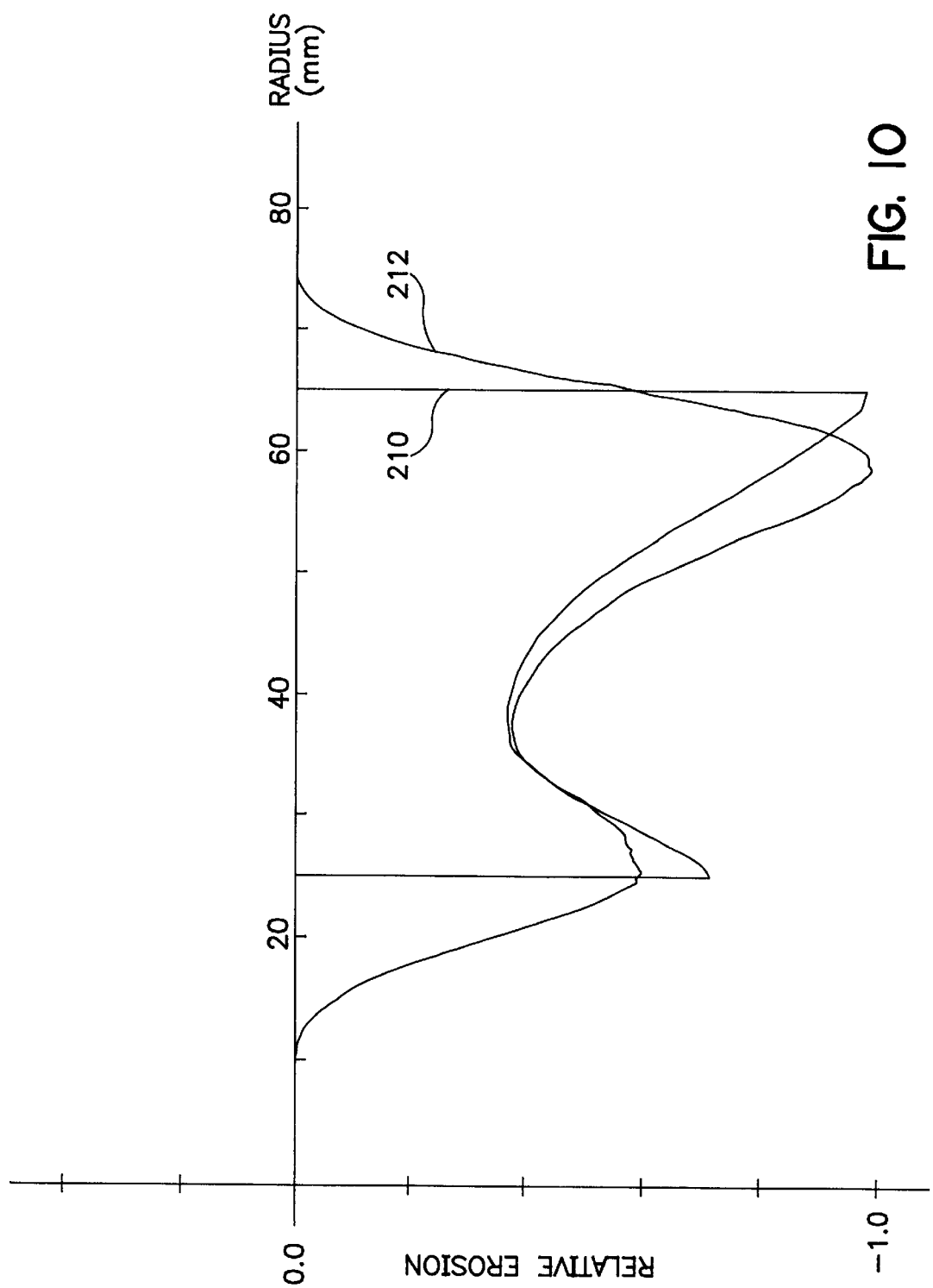
FIG. 10 is a graph of erosion depth as a function of radial position, showing a comparison of the optimized ideal erosion profile and the predicted erosion profile for a second embodiment in accordance with the invention.

As a second embodiment of the invention, curve 210 in FIG. 10 shows an optimized ideal erosion profile designed in accordance with the invention, for deposition with uniform thickness onto an annular substrate with 25 millimeters inside diameter and 95 millimeters outside diameter, at a source-to-substrate distance of 40 millimeters. The extent of the erosion is limited to 50 millimeters inside diameter and 130 millimeters outside diameter. The idealized optimized profile ends sharply at the assumed inner and outer limits.

Figure 11:
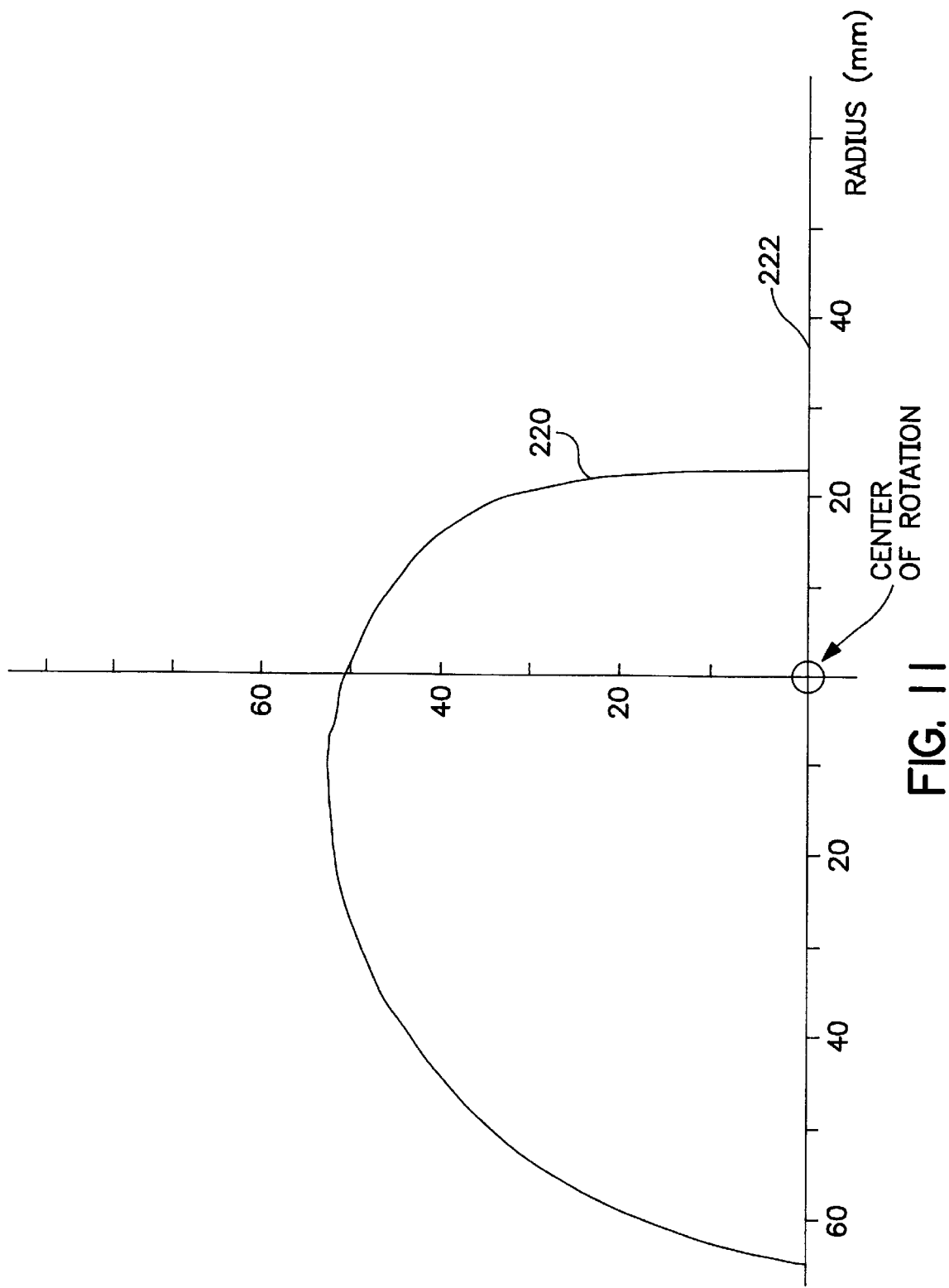
FIG. 11 is a schematic plan view of one half of the center line of a plasma track for the second embodiment in accordance with the invention.

Curve 220 in FIG. 11 is the centerline of one half of a plasma track designed in accordance with the invention to generate approximately the ideal erosion profile in FIG. 10 (curve 210). The track is symmetric with respect to line 222. It is not possible in practice to bound the erosion with vertical walls, because the plasma track is assumed to have a Gaussian cross section (with FWHM=10 millimeters in this embodiment). Curve 212 in FIG. 10 is the erosion profile predicted for the track in FIG. 11 (curve 220). The fit of the predicted erosion profile to the ideal erosion profile is seen to be fairly good. As a check, the predicted performance for the given track was calculated. The predicted thickness uniformity was ±3.5% and the predicted inventory (0.25 inch thick target) was 14.8 M Å. This performance is good, superior to many of the older design sputtering deposition sources still in use. However, this design is not predicted to produce erosion over the entire central region, unlike the first embodiment discussed above.

In some applications of sputtered films, it may be desirable to have a film thickness that varies with radius. For example, for memory disks, it may be desirable to have the thickness of the magnetic alloy decrease with outward radius, to maintain a more nearly constant signal strength in accommodation to the radially varying linear disk speed and radially varying head fly height.

Figure 12:
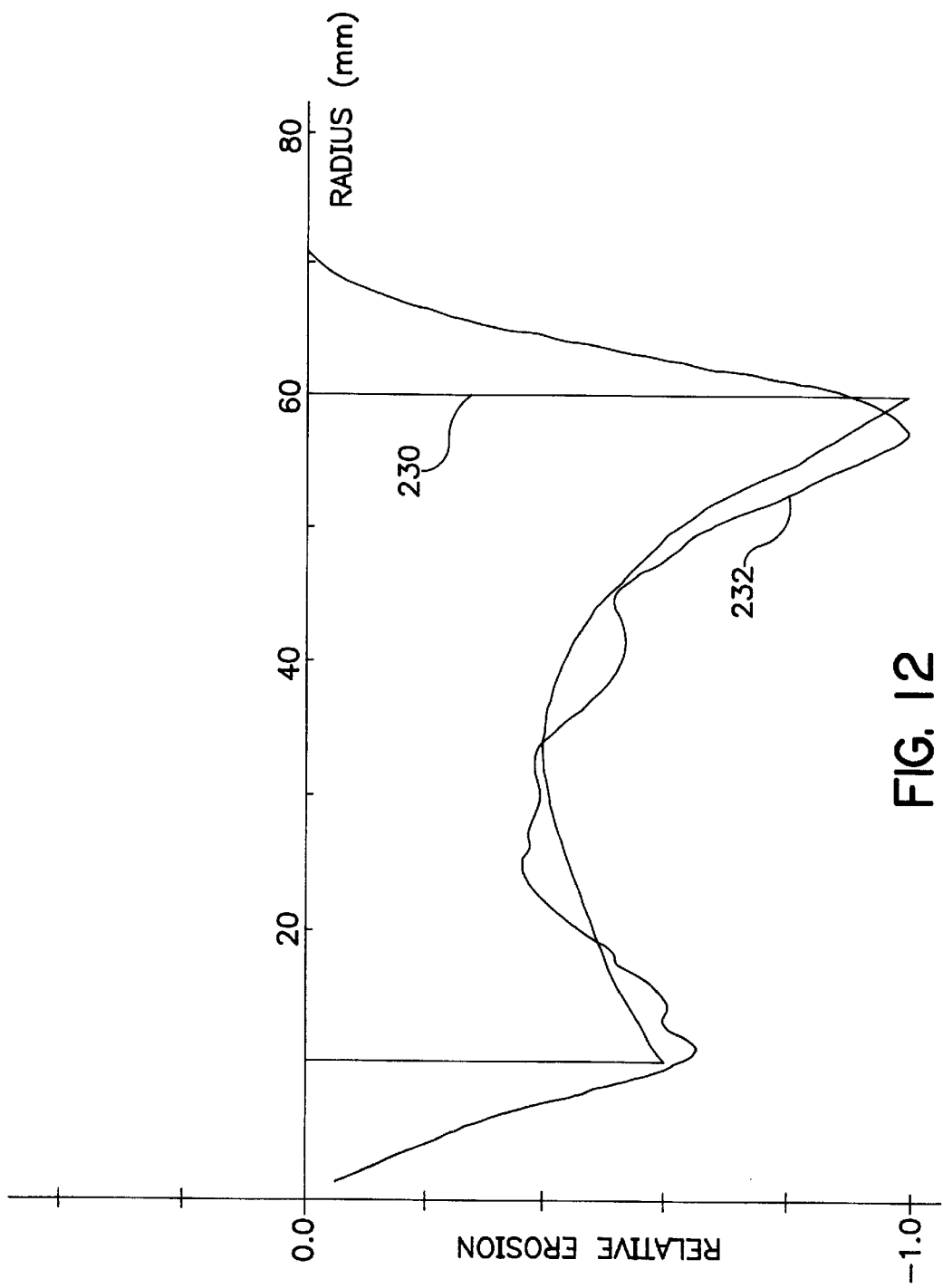
FIG. 12 is a graph of erosion depth as a function of radial position, showing a comparison of the optimized ideal erosion profile and the predicted erosion profile for a third embodiment in accordance with the invention.

As a third embodiment of the invention, curve 230 in FIG. 12 shows an optimized radial erosion profile designed in accordance with the invention, for deposition with thickness declining parabolically by 15% radially outward onto an annular substrate with 25 millimeters inside diameter and 95 millimeters outside diameter, at a source-to-substrate distance of 30 millimeters. The extent of the erosion is limited to 20 millimeters inside diameter and 120 millimeters outside diameter. The idealized optimized profile ends sharply at the assumed inner and outer limits.

Figure 13:
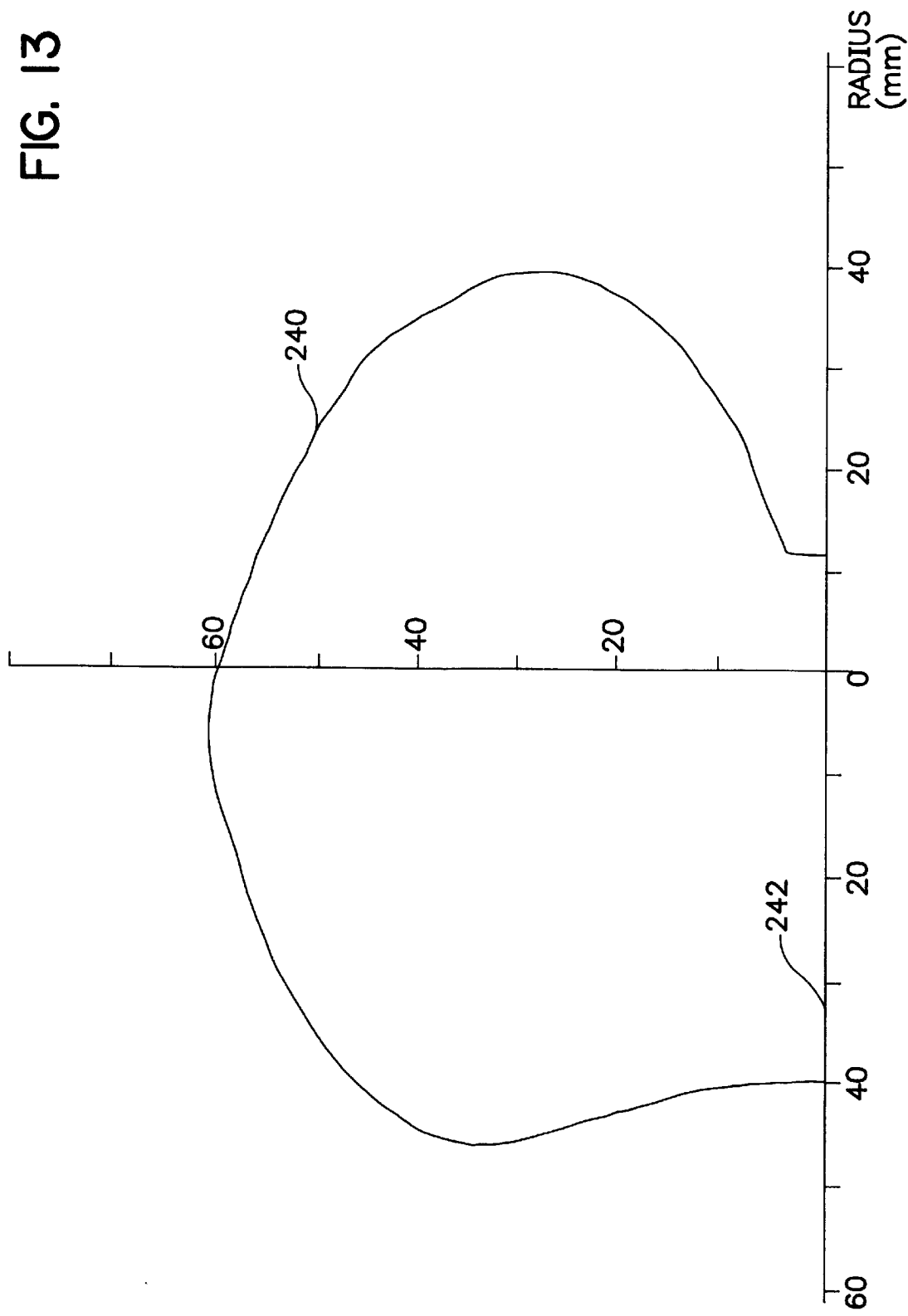
FIG. 13 is a schematic plan view of one half of the center line of a plasma track for the third embodiment in accordance with the invention.

Curve 240 in FIG. 13 is the centerline of one half of a plasma track designed in accordance with the invention to generate approximately the ideal erosion profile in FIG. 12 (curve 230). The track is symmetric with respect to line 242. It is not possible in practice to bound the erosion with vertical walls, because the plasma track is assumed to have a Gaussian cross section (with FWHM=10 millimeters in this embodiment). Curve 232 in FIG. 12 is the erosion profile predicted for the track in FIG. 13 (curve 240). The fit of the predicted erosion profile to the ideal erosion profile is seen to be fairly good.

Figure 14:
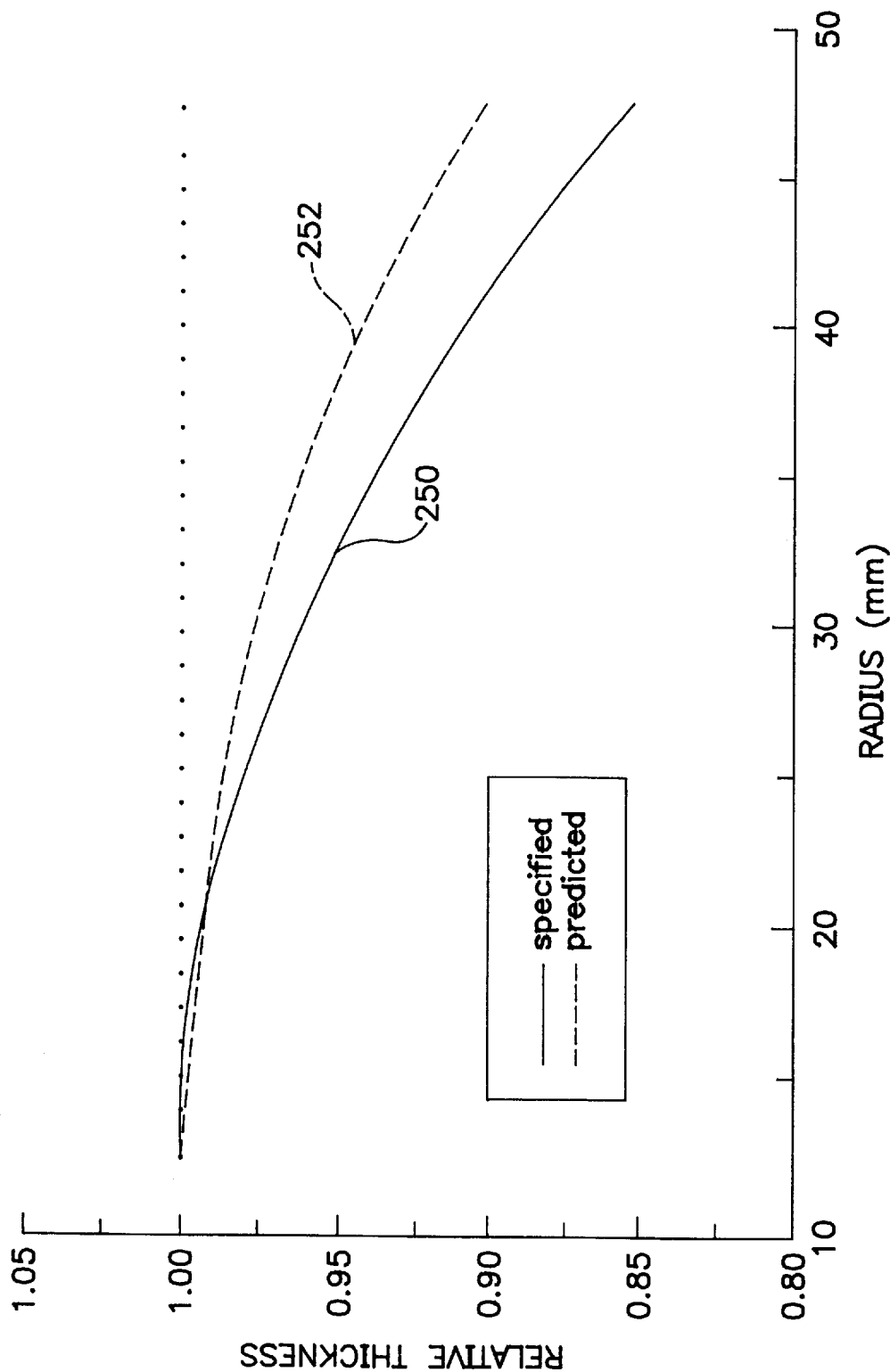
FIG. 14 is a graph of relative thickness as a function of radius, showing a comparison of the ideal radial thickness variation and the predicted radial thickness variation for the third embodiment in accordance with the invention.

Curve 250 in FIG. 14 is the specified thickness distribution for the third embodiment. The thickness is specified to decrease by 15% toward the outer radius of the substrate, following a parabolic variation. Curve 252 in FIG. 14 is the predicted thickness distribution for the plasma track in FIG. 13 (curve 232). The fit of the predicted thickness distribution to the specified thickness distribution is seen to be good.

Having thus described at least one illustrative embodiment of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

I claim:

1. A magnetron sputtering source for forming a sputtered film on a substrate in a magnetron sputtering apparatus, comprising:

a target having a surface from which material is sputtered; and a magnet assembly consisting of an array of single magnet bars that is rotatable about an axis of rotation with respect to said target, said magnet assembly producing on said target an erosion profile that approximates a solution to an equation of the form $$\int_a^b K(r,r')e(r')r'dr' = t(r)$$

where e(r') is the erosion profile, t(r) is a desired radial thickness distribution of the sputtered film, K(r,r') is a function depending on the sputter geometry and process conditions, r is the radial position on the substrate, r' is the radial position on the target, and a and b are the radial limits of erosion on the target.

2. A magnetron sputtering source as defined in claim 1 wherein the desired radial thickness distribution of the sputtered film is uniform within a prescribed tolerance range up to ±5%.

3. A magnetron sputtering source as defined in claim 1 wherein the desired radial thickness distribution of the sputtered film follows a specified variation within a prescribed tolerance range within ±5%.

4. A magnetron sputtering source as defined in claim 1 wherein the erosion profile on said target covers substantially the entire exposed surface of said target facing the substrate.

5. A magnetron sputtering source as defined in claim 1 wherein said magnet assembly produces on the surface of said target a plasma track having a shape characterized by a pair of symmetrical lobes, a deeply indented first inward cusp located near the axis of rotation and a moderately indented second inward cusp, said first and second cusps being located on opposite sides of said plasma track, each of said lobes having a relatively long section of substantially constant radius with respect to the axis of rotation.

6. A magnetron sputtering source in accordance with claim 1 for forming a sputtered film on a substrate in a magnetron sputtering apparatus in which said magnet assembly is rotatable about an axis of rotation with respect to said target for producing on the surface of said target a plasma track having a shape characterized by a pair of symmetrical lobes, a deeply indented first inward cusp located near the axis of rotation and a moderately indented second inward cusp, said first and second cusps being located on opposite sides of said plasma track, each of said lobes having a relatively long section of at least about ½ in angular extent of substantially constant radius with respect to the axis of rotation.

7. A magnetron sputtering source as defined in claim 6 wherein the relatively long section of substantially constant radius has an arc length of about 100°.

8. A magnetron sputtering source in accordance with claim 1, wherein said target and said substrate being positioned at a distance from each other of less than about 35 millimeters.

9. A method for configuring a rotatable magnet assembly for use in a magnetron sputtering apparatus including a target having a surface from which material is sputtered to form a sputtered film on a substrate, comprising the steps of:

determining an erosion profile on said target that approximates a solution to an equation of the form $$\int_a^b K(r,r')e(r')r'dr' = t(r)$$

where e(r') is the erosion profile, t(r) is a desired radial thickness distribution of the sputtered film, K(r,r') is a function depending on the sputter geometry and process conditions, r is the radial position on the substrate, r' is the radial position on the target, and a and b are the radial limits of erosion on the target; and determining a magnet structure for said rotatable magnet assembly that produces an acceptable approximation to the erosion profile e(r').

10. A method as defined in claim 9 wherein the step of determining a magnet structure includes:

determining a plasma track on the surface of said target that produces the erosion profile e(r'); and determining the magnet structure that produces said plasma track.

11. A method as defined in claim 10 wherein said plasma track has a shape characterized by a pair of symmetrical lobes, a deeply indented first inward cusp located near the axis of rotation and a moderately indented second inward cusp, said first and second cusps being located on opposite sides of said plasma track, each of said lobes having a relatively long section of substantially constant radius with respect to the axis of rotation.

12. A method as defined in claim 9 wherein the step of determining an erosion profile includes determining an erosion profile on said target that covers substantially the entire exposed surface of said target facing the substrate.

13. A method as defined in claim 9 wherein the step of determining an erosion profile includes determining an erosion profile wherein said desired radial thickness distribution is uniform within a prescribed tolerance range up to ±5%.

14. A method as defined in claim 9 wherein the step of determining an erosion profile includes determining an erosion profile wherein said desired radial thickness distribution follows a specified variation within a prescribed tolerance range within ±5%.

15. A magnetron sputtering apparatus comprising:

a first magnetron sputtering source for forming a sputtered film on a first surface of a substrate, said first magnetron sputtering source including a first target having a surface from which material is sputtered and a first magnet assembly consisting of an array of single magnet bars that is rotatable about an axis of rotation with respect to said first target, said magnet assembly producing on said target an erosion profile that approximates a solution to an equation of the form $$\int_a^b K(r,r')e(r')r'dr' = t(r)$$

where e(r') is the erosion profile, t(r) is a desired radial thickness distribution of the sputtered film, K(r,r') is a function depending on the sputter geometry and process conditions, r is the radial position on the substrate, r' is the radial position on the target, and a and b are the radial limits of erosion on the target;

a second magnetron sputtering source for forming a sputtered film on a second surface of said substrate, said second magnetron sputtering source including a second target having a surface from which material is sputtered and a second magnet assembly consisting of an array of single magnet bars that is rotatable about an axis of rotation with respect to said second target, said magnet assembly producing on said target an erosion profile that approximates a solution to an equation of the form $$\int_a^b K(r,r')e(r')r'dr' = t(r)$$

where e(r') is the erosion profile, t(r) is a desired radial thickness distribution of the sputtered film, K(r,r') is a function depending on the sputter geometry and process conditions, r is the radial position on the substrate, r' is the radial position on the target, and a and b are the radial limits of erosion on the target, said first and second magnet assemblies producing on the surfaces of said first and second targets plasma tracks, each having a shape characterized by a pair of symmetrical lobes, a deeply indented first inward cusp located near the axis of rotation and a moderately indented second inward cusp, said first and second cusps being located on opposite sides of said plasma track, each of said lobes having a relatively long section of substantially constant radius with respect to the axis of rotation; and a vacuum system for producing a vacuum in regions between each target surface and the substrate.

16. A magnetron sputtering apparatus as defined in claim 15 wherein said first and second magnetron sputtering sources each produce on the substrate a radial thickness distribution of the sputtered film that is uniform within a prescribed tolerance range up to ±5%.

17. A magnetron sputtering apparatus as defined in claim 15 wherein a source-to-substrate distance for each of said first and second magnetron sputtering sources is less than about 35 millimeters and wherein each of said first and second magnetron sputtering sources produces a radial thickness distribution of the sputtered film on the substrate that is uniform to better than about ±5%.

* * * * *